(12) United States Patent
Park et al.

(10) Patent No.: US 10,446,455 B2
(45) Date of Patent: Oct. 15, 2019

(54) FINGERPRINT SENSOR AND MANUFACTURING METHOD THEREOF

(71) Applicant: Amkor Technology, Inc., Tempe, AZ (US)

(72) Inventors: Sung Sun Park, Seoul (KR); Ji Young Chung, Seongnam-si (KR); Christopher Berry, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/591,416

(22) Filed: May 10, 2017

(65) Prior Publication Data

US 2017/0243798 A1 Aug. 24, 2017

Related U.S. Application Data

(63) Continuation of application No. 15/131,967, filed on Apr. 18, 2016.

(30) Foreign Application Priority Data

May 12, 2015 (KR) ........................ 10-2015-0065900

(51) Int. Cl.
*G06K 9/00* (2006.01)
*H01L 23/053* (2006.01)
(Continued)

(52) U.S. Cl.
CPC .............. *H01L 23/053* (2013.01); *B81C 3/00* (2013.01); *G06K 9/00013* (2013.01); *G06K 9/00053* (2013.01); *H01L 24/05* (2013.01); *H01L 24/16* (2013.01); *H01L 24/32* (2013.01); *H01L 24/73* (2013.01); *H01L 23/3128* (2013.01); *H01L 24/03* (2013.01); *H01L 24/11* (2013.01); *H01L 24/13* (2013.01); *H01L 24/27* (2013.01); *H01L 24/29* (2013.01); *H01L 24/33* (2013.01); *H01L 24/81* (2013.01); *H01L 24/83* (2013.01); *H01L 24/92* (2013.01); *H01L 2224/0345* (2013.01); *H01L 2224/0347* (2013.01); *H01L 2224/0361* (2013.01); *H01L 2224/03452* (2013.01); *H01L 2224/03464* (2013.01); *H01L 2224/03912* (2013.01); *H01L 2224/0401* (2013.01);
(Continued)

(58) Field of Classification Search
None
See application file for complete search history.

(56) References Cited

U.S. PATENT DOCUMENTS

| 8,717,775 B1 * | 5/2014 | Bologna | G06K 9/00053 361/761 |
|---|---|---|---|
| 2011/0254108 A1 * | 10/2011 | Gozzini | G06K 9/00053 257/415 |

(Continued)

*Primary Examiner* — Daniel Whalen
(74) *Attorney, Agent, or Firm* — McAndrews, Held & Malloy, Ltd.

(57) ABSTRACT

A fingerprint sensor device and a method of making a fingerprint sensor device. As non-limiting examples, various aspects of this disclosure provide various fingerprint sensor devices, and methods of manufacturing thereof, that comprise a sensing area on a bottom side of a die without top side electrodes that senses fingerprints from the top side, and/or that comprise a sensor die directly electrically connected to conductive elements of a plate through which fingerprints are sensed.

14 Claims, 10 Drawing Sheets

(51) Int. Cl.
  *H01L 23/00* (2006.01)
  *B81C 3/00* (2006.01)
  *H01L 23/31* (2006.01)
(52) U.S. Cl.
  CPC .............. *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/05684* (2013.01); *H01L 2224/119* (2013.01); *H01L 2224/1132* (2013.01); *H01L 2224/1146* (2013.01); *H01L 2224/1147* (2013.01); *H01L 2224/11334* (2013.01); *H01L 2224/11849* (2013.01); *H01L 2224/131* (2013.01); *H01L 2224/133* (2013.01); *H01L 2224/13013* (2013.01); *H01L 2224/13014* (2013.01); *H01L 2224/13111* (2013.01); *H01L 2224/13147* (2013.01); *H01L 2224/13294* (2013.01); *H01L 2224/16227* (2013.01); *H01L 2224/2732* (2013.01); *H01L 2224/2784* (2013.01); *H01L 2224/27312* (2013.01); *H01L 2224/27622* (2013.01); *H01L 2224/29006* (2013.01); *H01L 2224/29007* (2013.01); *H01L 2224/29011* (2013.01); *H01L 2224/2919* (2013.01); *H01L 2224/2929* (2013.01); *H01L 2224/2939* (2013.01); *H01L 2224/29294* (2013.01); *H01L 2224/29299* (2013.01); *H01L 2224/32225* (2013.01); *H01L 2224/33181* (2013.01); *H01L 2224/73204* (2013.01); *H01L 2224/73253* (2013.01); *H01L 2224/8146* (2013.01); *H01L 2224/8185* (2013.01); *H01L 2224/81191* (2013.01); *H01L 2224/81203* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81464* (2013.01); *H01L 2224/81466* (2013.01); *H01L 2224/81471* (2013.01); *H01L 2224/81484* (2013.01); *H01L 2224/81815* (2013.01); *H01L 2224/83101* (2013.01); *H01L 2224/83102* (2013.01); *H01L 2224/83192* (2013.01); *H01L 2224/9211* (2013.01); *H01L 2224/92125* (2013.01); *H01L 2224/92225* (2013.01); *H01L 2924/014* (2013.01); *H01L 2924/1815* (2013.01); *H01L 2924/18161* (2013.01)

(56) References Cited

U.S. PATENT DOCUMENTS

2016/0172264 A1* 6/2016 Teng ................ H01L 23/295
  257/414
2016/0212861 A1* 7/2016 Cheng ................ G06K 9/00053

* cited by examiner

FINGERPRINT SENSOR AND MANUFACTURING METHOD THEREOF

CROSS-REFERENCE TO RELATED APPLICATIONS/INCORPORATION BY REFERENCE

The present application is a continuation of U.S. patent application Ser. No. 15/131,967, filed Apr. 18, 2016, and titled "FINGERPRINT SENSOR AND MANUFACTURING METHOD THEREOF," which makes reference to, claims priority to, and claims the benefit of Korean Patent Application No. 10-2015-0065900, filed on May 12, 2015, in the Korean Intellectual Property Office and titled "PACKAGE OF FINGERPRINT SENSOR AND FABRICATING METHOD THEREOF," the contents of each of which are hereby incorporated herein by reference in their entirety.

BACKGROUND

Present semiconductor packages and methods for forming sensor devices (e.g., fingerprint sensor devices) are inadequate, for example resulting in inadequate sensing accuracy and/or device reliability, manufacturability issues, devices that are thicker than necessary, devices that are difficult and/or costly to incorporate into other products, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
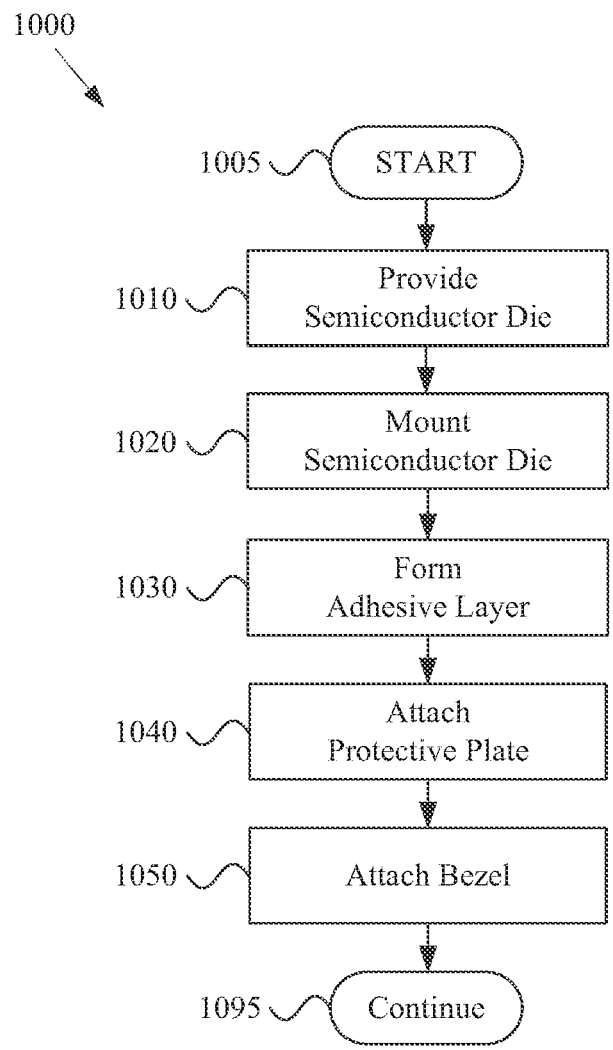
FIG. 1 shows a flow diagram of an example method of making a sensor device, in accordance with various aspects of the present disclosure.

Various aspects of this disclosure provide a fingerprint sensor device and a method of making a fingerprint sensor device. As non-limiting examples, various aspects of this disclosure provide various fingerprint sensor devices, and methods of manufacturing thereof, that comprise a sensing area on a bottom side of a die without top side electrodes that senses fingerprints from the top side, and/or that comprise a sensor die directly electrically connected to conductive elements of a plate through which fingerprints are sensed.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion.

Further, it should be understood that when an element A is referred to as being "connected to" or "coupled to" an element B, the element A can be directly connected to the element B or indirectly connected to the element B (e.g., an intervening element C (and/or other elements) may be positioned between the element A and the element B).

It should be understood that although the examples presented herein primarily concern fingerprint sensors and manufacturing methods thereof, the scope of this disclosure is not limited thereto. The various aspects of this disclosure, for example, are readily applicable to other forms of sensors (e.g., blood vessel sensors, temperature sensors, humidity sensors, image sensors, general biometric sensors, eye or retinal sensors, voice sensors, material detectors, etc.).

Additionally, it should be understood that the examples present herein are not limited to any particular type of fingerprint sensing (e.g., an optical sensing type, a semiconductor sensing type, etc.). In an example scenario involving a semiconductor sensing type of fingerprint sensor, the various examples presented herein are not limited to any particular type of such sensing (e.g., utilizing a temperature and/or pressure sensor, utilizing a capacitance sensor, etc.). Further, it should be understood that the examples presented herein may apply to a so-called single sensing device or technique, in which the entire fingerprint is sensed at one time, and/or to a so-called continuous sensing device or technique, in which partially scanned fingerprints are continuously (or serially) sensed (e.g., as a finger is swiped, etc.).

Various aspects of the present disclosure provide a fingerprint sensor device (or package) that can sense a fingerprint based on a change in capacitance, in a configuration in which first conductive bumps and a fingerprint sensing unit (or area) are on one surface of a semiconductor die and a finger (or fingerprint thereof) is in proximity to a protective layer (e.g., a protection plate, a protection coating, etc.) on another surface of the semiconductor die.

Various aspects of the present disclosure also provide a fingerprint sensor device (or package) architecture that can simplify a manufacturing (or fabricating) process of the fingerprint sensor device, for example by mounting a semiconductor die with a fingerprint sensing unit (or area) on a substrate in a flip chip configuration (e.g., to a package substrate, to a plate or layer through which a fingerprint may be sensed, etc.).

Various aspects of the present disclosure additionally provide a fingerprint sensor device (or package), and manufacturing method thereof, that includes a substrate (e.g., rectangular-shaped, plate-shaped, etc.) having a first surface and a second surface opposite the first surface, a semiconductor die having a planar first die surface and a second die surface opposite the first die surface and including a plurality of first conductive bumps, electrically connected to the substrate, and a fingerprint sensing unit (or area) on the second die surface, a protection plate on the first die surface, and a bezel that affixes (or holds, or couples) the protection plate to the substrate.

Various aspects of the present disclosure further provide a fingerprint sensor device (or package), and a manufacturing method thereof, that includes a substrate (e.g., rectangular-shaped, plate-shaped, etc.) having a first surface and a second surface opposite the first surface, a semiconductor die having a planar first die surface and a second die surface opposite the first die surface and including a plurality of first conductive bumps, electrically connected to the substrate, and a fingerprint sensing unit (or area) on the second die surface, an encapsulating material that surrounds side portions of the semiconductor die, and a protective layer coated on the first surface of the semiconductor die.

Various aspects of the present disclosure still further provide a fingerprint sensor device (or package), and a manufacturing method thereof, that includes a substrate having a planar first surface and a second surface opposite the first surface, a semiconductor die having a planar first die surface and a second die surface opposite the first die surface and including a plurality of first conductive bumps, electrically connected to the second surface of the substrate, and a fingerprint sensing unit (or area) on the second die surface, an encapsulating material that surrounds the first surface of the substrate and side portions and the first die surface of the semiconductor die, and a protective layer coated on (or over) the second surface of the substrate.

Various aspects of the present disclosure provide a fingerprint sensor device (or package) that includes a semiconductor die having a planar first die surface and a second die surface opposite the first die surface and including a plurality of first conductive bumps and a fingerprint sensing unit (or area) on the first die surface, a protection plate electrically connected to the plurality of first conductive bumps on the first die surface and including a plurality of second conductive bumps on the protection plate, a substrate (e.g., rectangular-shaped, plate-shaped, etc.) having the second die surface mounted on a first substrate surface thereof and having the first substrate surface electrically connected to the plurality of second conductive bumps, and a bezel affixing the protection plate to the substrate.

Various aspects of the present disclosure also provide a fingerprint sensor device (or package), or manufacturing method thereof, that includes a substrate having a top substrate side, a bottom substrate side, and lateral substrate sides between the top and bottom substrate sides; a semiconductor die having a top die side, a bottom die side, and lateral die sides between the top and bottom die sides, wherein the bottom die side includes a sensing area comprising fingerprint sensing circuitry; a plurality of first interconnection structures electrically connecting the bottom die side to the top substrate side; and a protection plate on the top die side through which a fingerprint is sensed, the protection plate having a top plate side, a bottom plate side, and lateral plate sides between the top and bottom plate sides.

The example fingerprint sensor device (or package) may also, for example, include a bezel coupled to the top substrate side and to the plate. The sensing area may, for example, be in a central area of the bottom die side, and the plurality of first interconnection structures may be positioned outside of the sensing area. The example fingerprint sensor device may, for example, include an adhesive layer adhered to the top die side and to the bottom plate side. The adhesive layer may, for example, completely cover the top die side. The example fingerprint sensor device may, for example, include no electrical conductors (e.g., sense traces or elements or electrodes, etc.) above the top die side. The example fingerprint sensor device may, for example, include a plurality of second interconnection structures coupled to the bottom plate side and to the top substrate side outside of a footprint of the semiconductor die, and where the protection plate includes a plurality of conductive traces, each of which electrically connected to a respective one of the second interconnection structures. The protection plate may, for example, be or include glass. The example fingerprint sensor device may, for example, include an interposer between the top die side and the protection plate. A plurality of second interconnection structures may, for example, be coupled to a bottom side of the interposer and to the top substrate side outside of a footprint of the semiconductor die, and the interposer may include a plurality of conductive traces, each of which electrically connected to a respective one of the second interconnection structures.

Various aspects of the present disclosure may additionally provide a fingerprint sensor device (or package), or method of manufacturing thereof, that includes a substrate having a top substrate side, a bottom substrate side, and lateral substrate sides between the top and bottom substrate sides; a semiconductor die having a top die side, a bottom die side, and lateral die sides between the top and bottom die sides, wherein the bottom die side comprises a sensing area comprising fingerprint sensing circuitry; a plurality of first interconnection structures electrically connecting the bottom die side to the top substrate side; an encapsulating material surrounding the lateral die sides; and a protective layer on the top die side through which a fingerprint is sensed, the protective layer having a top protective layer side, a bottom protective layer side, and lateral protective layer sides between the top and bottom protective layer sides.

The encapsulating material may, for example, have a top side that is coplanar with the top die side. The protective layer may, for example, comprise a coating. The protective layer may, for example, completely cover the top die side. The protective layer may, for example, cover at least a portion of a top side of the encapsulating material.

Various aspects of the present disclosure may further provide a fingerprint sensor device (or package), or method of manufacturing thereof, that includes a substrate having a top substrate side, a bottom substrate side, and lateral substrate sides between the top and bottom substrate sides; a plate through which a fingerprint is sensed, the plate having a top plate side, a bottom plate side, and lateral plate sides between the top and bottom plate sides; a semiconductor die having a top die side, a bottom die side, and lateral die sides between the top and bottom die sides, where the top die side includes a sensing area comprising fingerprint sensing circuitry; and a plurality of first conductive interconnection structures electrically connecting the top die side to the bottom plate side.

The plate may, for example, comprise a plurality of conductive traces, each of which is coupled to a respective one of the first conductive interconnection structures. In an example implementation, the plurality of conductive traces may be embedded within the plate. The example fingerprint sensor device may, for example, include a plurality of second conductive interconnection structures, each of which coupled to a respective one of the conductive traces of the plate and to the top substrate side. The example fingerprint sensor device may also, for example, include an adhesive layer that adheres the bottom die side to the top substrate side.

The above and other aspects of the present disclosure will be described in or be apparent from the following description of various example implementations. Various aspects of the present disclosure will now be presented with reference to accompanying drawings.

Note that although the examples provided herein are generally presented in the context of forming of a single fingerprint sensor device, this is for illustrative clarity only. In an example implementation, a plurality of such devices may be formed in a panel or wafer form, wherein singulation is performed at the appropriate point in the process, after which additional processes may be performed at the single-device level.

FIG. 1 shows a flow diagram of an example method 1000 of making a sensor device (e.g., a fingerprint sensor device), in accordance with various aspects of the present disclosure. The example method 1000 may, for example, share any or all characteristics with any other method discussed herein (e.g., the example method 3000 of FIG. 3, the example method 5000 of FIG. 5, etc.). FIGS. 2A-2E show cross-sectional views illustrating example sensor devices and example methods of making sensor device, in accordance with various aspects of the present disclosure. The structures shown in 2A-2E may share any or all characteristics with analogous structures shown in FIGS. 4A-4B, FIGS. 6A-6E, FIGS. 7-9, etc. FIGS. 2A-2E may, for example, illustrate an example sensor device (e.g., a fingerprint sensor device) at various stages (or blocks) of the example method 1000 of FIG. 1. FIGS. 1 and 2A-2E will now be discussed together. It should be noted that the order of the example blocks of the example method 1000 may vary, various blocks may be omitted, and/or various blocks may be added without departing from the scope of this disclosure.

In general, the example method 1000 may comprise providing a semiconductor die (block 1010), mounting the semiconductor die (block 1020), forming an adhesive layer (block 1030), attaching a protective plate (block 1040), and attaching a bezel (block 1050).

The example method 1000 may begin executing at block 1005. The example method 1000 may begin executing in response to any of a variety of causes or conditions, non-limiting examples of which are provided herein. For example, the example method 1000 may begin executing in response to receiving a process flow from another block of the example method 1000 or another method (e.g., the example method 3000 of FIG. 3, the example method 5000 of FIG. 5, or any blocks or portions thereof, etc.). Also for example, the example method 1000 may begin executing in response to the arrival of materials utilized by the method 1000, in response to the availability of processes or equipment or other resources utilized by the method 1000, etc. Additionally, for example, the example method 1000 may begin executing in response to a user and/or automated command to begin (e.g., from a process controller, safety system, etc.). In general, the example method 1000 may begin executing in response to any of a variety of causes or conditions. Accordingly, the scope of this disclosure is not limited by characteristics of any particular initiating cause or condition.

The example method 1000 may, at block 1010, comprise providing a semiconductor die. Block 1010 may comprise providing (e.g., receiving and/or preparing, etc.) the semiconductor die in any of a variety of manners, non-limiting examples of which are provided herein.

Block 1010 may, for example, comprise receiving the semiconductor die in a completely prepared or partially prepared state. For example, block 1010 may comprise receiving the fully or partially prepared die from a fabrication facility or associated distribution facility at a different geographical location, from an upstream manufacturing process at a same general geographical location, etc. For example, any or all of the semiconductor die-preparing activities discussed herein may be performed on-site or off-site in relation to any other processing activity discussed herein.

The semiconductor die may, for example, comprise a first side (e.g., a planar top side or surface, etc.), a second side (e.g., a planar bottom side or surface, etc.), and one or more peripheral sides (e.g., planar lateral sides or surfaces, etc.) between the first side and the second side. The semiconductor die may, for example, have a thickness (e.g., distance between the first and second sides) in the range of 50 μm to 150 μm. The semiconductor die may, for example, have a thickness less than 150 μm or less than 100 μm. If the semiconductor die is too thick, such thickness may inhibit sensing a fingerprint (e.g., sensing a fingerprint through the semiconductor die). Thus, in various implementation discussed herein, the semiconductor die may be prepared to be thin enough to effectively sense a fingerprint through the thickness of the die. In an example implementation the entire first side and the entire second side of the semiconductor die may be planar (e.g., without a step or notch at a peripheral edge thereof, etc.).

The second side of the semiconductor die may, for example, comprise a fingerprint sensing unit. The fingerprint sensing unit may, for example, comprise fingerprint sensing circuitry (e.g., traces, electrodes, optical elements, capacitive sensing elements, etc.) and/or fingerprint processing circuitry (e.g., logic circuitry that operates to process or analyze fingerprint-related signals received from fingerprint sensing circuitry, etc.). The fingerprint sensing unit may, for example, detect fingerprints by sensing and analyzing capacitance (e.g., changes in, or patterns of, capacitance), optical imagery, temperature, pressure, etc. The portion of the fingerprint sensing unit (e.g., on the second side of the semiconductor die) that senses fingerprint characteristics may generally be referred to herein as a fingerprint sensing area. In an example implementation, the fingerprint sensing area may be located in a central (or centered) region of the semiconductor die. The fingerprint sensing area may, for example, be rectangular, square, etc. The semiconductor die, for example in a top view, may similarly for example be square, rectangular, etc.

The second side of the semiconductor die may, for example, comprise one or more conductive interconnection structures, which may also be referred to herein as interconnection structures. Such conductive interconnection structures may, for example, comprise conductive bumps or balls (e.g., solder bumps or balls, etc.), metal pillars or posts (e.g., copper pillars or posts, etc.), etc. In an example implementation, the conductive interconnection structures may be positioned on the second side of the semiconductor die outside of (and/or around) the perimeter of the sensing area of the sensing unit. For example, such interconnection structures may surround the sensing unit (or sensing area) on any number of sides (e.g., on two sides, four sides, three sides, one side, etc.). Additionally, the conductive interconnection structures may be taller (e.g., from the second side of the substrate) than any part of the sensing unit on the semiconductor die (e.g., electronic device elements, electrodes, traces, patterns, pads, lands, probes, etc.).

Block 1010 may comprise preparing the semiconductor die in any of a variety of manners. For example, to obtain the desired thinness (or thickness) of the semiconductor die, block 1010 may comprise thinning the semiconductor die to the desired thickness. For example, block 1010 may comprise grinding the first side of the semiconductor die (e.g., a back or inactive side of the semiconductor die) to achieve the desired thickness. Also for example, block 1010 may comprise performing the thinning by utilizing chemical/mechanical planarization (CMP) and/or any other type of thinning process. Block 1010 may, for example, comprise thinning the semiconductor die as a single die or as a wafer of die, for example in a wafer thinning process. In such manner, the semiconductor die may be singulated (or diced) from the wafer after the thinning. Note that in an example implementation, the thinning may also occur after the die mounting performed at block 1020.

Block 1010 may comprise forming the conductive interconnection structures in any of a variety of manners. In an example scenario in which the conductive interconnection structures comprise conductive bumps or balls (e.g., solder bumps or balls, wafer bumps or balls, etc.), such balls or bumps may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosures is not limited thereto. Block 1010 may comprise forming or attaching such interconnection structures by ball-dropping, bumping, metal-plating, pasting and reflowing, etc. For example, block 1010 may comprise dropping a conductive ball, for example on a conductive pad or under bump metallization (UBM), reflowing, and cooling.

Also, in an example scenario in which a conductive interconnection structure comprise a metal pillar or post, block 1010 may, for example, comprise forming such structure on an interconnection pad (e.g., as formed at a previous portion of block 1010) or other conductive layer portion. As discussed herein, such an interconnection pad may, for example, comprise any of a variety of conductive materials (e.g., copper, aluminum, silver, gold, nickel, alloys thereof, etc.). The interconnection pad may, for example, be exposed through an aperture in a dielectric layer (e.g., a top dielectric layer) of the die or substrate. The dielectric layer may, for example, cover side surfaces of the interconnection pad and/or an outer perimeter of the top surface of the interconnection pad.

Block 1010 may, for example, comprise forming a UBM seed layer over the dielectric layer and/or over the portion of the interconnection pad that is exposed through the aperture in the dielectric layer. As discussed herein, the UBM seed layer may, for example, comprise any of a variety of conductive materials (e.g., copper, gold, silver, metal, etc.). The UBM seed layer may be formed in any of a variety of manners (e.g., sputtering, electroless plating, chemical vapor deposition (CVD), physical vapor deposition (PVD), atomic layer deposition (ALD), plasma vapor deposition, etc.).

Block 1010 may, for example, comprise forming a mask (or template) over the UBM seed layer to define a region (or volume) in which a UBM and/or the conductive pillar (or other interconnection structure) is to be formed. For example, the mask may comprise a photoresist (PR) material or other material, which may be patterned to cover regions other than the region on which a UBM and/or conductive pillar is to be formed. Block 1010 may then, for example, comprise forming a UBM layer on the UBM seed layer exposed through the mask. As discussed herein, the UBM may comprise any of a variety of materials (e.g., titanium, chromium, aluminum, titanium/tungsten, titanium/nickel, copper, alloys thereof, etc.). Block 1010 may comprise forming the UBM on the UBM seed layer in any of a variety of manners (e.g., sputtering, electroless plating, chemical vapor deposition (CVD), physical vapor deposition (PVD), atomic layer deposition (ALD), plasma vapor deposition, etc.).

Block 1010 may then, for example, comprise forming the conductive pillar on the UBM. The conductive pillar (or post) may comprise any of a variety of characteristics. For example, the conductive pillar may be cylinder-shaped, elliptical cylinder-shaped, rectangular post-shaped, etc.). The conductive pillar may comprise a flat upper end, a concave upper end, or a convex upper end. The conductive pillar may, for example, comprise any of the materials discussed herein with regard to the conductive layers. In an example implementation, the conductive pillar may comprise copper (e.g., pure copper, copper with some impurities, etc.), a copper alloy, etc.). In an example implementation, block 1010 (or another block of the example method 1000) may also comprise forming a solder cap (or dome) on the conductive pillar.

After forming the conductive pillar(s), block 1010 may comprise stripping or removing the mask (e.g., chemical stripping, ashing, etc.). Additionally, block 1010 may comprise removing at least a portion of the UBM seed layer (e.g., at least the portion that is not covered by the conductive pillar (e.g., by chemically etching, etc.). Note that during the etching of the seed layer, a lateral edge portion of at least the UBM seed layer may, for example, be etched. Such etching may, for example, result in an undercut beneath the conductive pillar and/or UBM.

It should be noted that although the example presented herein generally concerns a single semiconductor die, any number of semiconductor die and/or other electronic components may also be provided.

Figure 2A:
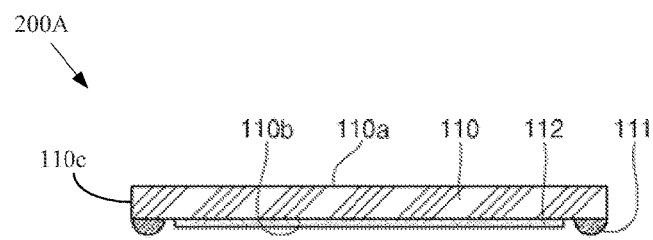
FIGS. 2A-2E show cross-sectional views illustrating example sensor devices and example methods of making sensor devices, in accordance with various aspects of the present disclosure.

An example implementation 200A showing various aspects of block 1010 is shown at FIG. 2A. The example implementation 200A (or assembly, sub-assembly, package, etc.) comprises a semiconductor die 110 having a first side 110a (e.g., a planar top side or surface, etc.), a second side 110b (e.g., a planar bottom side or surface, etc.), and one or more peripheral sides 110c (e.g., planar lateral sides or surfaces, etc.) between the first side 110a and the second side 100b. The semiconductor die 110 may, for example, have a thickness (e.g., distance between the first and second sides) in the range of 50 µm to 150 µm. The semiconductor die 110a may, for example, have a thickness less than 150 µm or less than 100 µm. In the example implementation 200A the entire first side 110a and the entire second side 110b of the semiconductor die 110 are planer (e.g., without a step or notch at a peripheral edge thereof, etc.).

The second side 110b of the example semiconductor die 110 comprises a fingerprint sensing unit 112. The example fingerprint sensing unit 112 comprises fingerprint sensing circuitry (e.g., traces, electrodes, optical elements, capacitive sensing elements, etc.) and/or fingerprint processing circuitry (e.g., logic circuitry that operates to process or analyze fingerprint-related signals received from fingerprint sensing circuitry, etc.). The fingerprint sensing unit 112 may, for example, detect fingerprints by sensing capacitance (e.g., changes in, or patterns of, capacitance), optical imagery, temperature, pressure, etc. The portion of the fingerprint sensing unit 112 (e.g., on the second side of the semiconductor die) that senses fingerprint characteristics may generally be referred to herein as a fingerprint sensing area. In an example implementation, the fingerprint sensing area may be located in a central (or centered) region of the semiconductor die 110. The fingerprint sensing area may, for example, be rectangular, square, etc. The semiconductor die 110, for example in a top view) may similarly for example be square, rectangular, etc.

The second side 110b of the example semiconductor die 110 comprises a plurality of conductive interconnection structures 111, which may also be referred to here as interconnection structures 111. Such conductive interconnection structures 111 may, for example, comprise conductive bumps or balls (e.g., solder bumps or balls, etc.), metal pillars or posts (e.g., copper pillars or posts), etc. In the example implementation 200A, the conductive interconnection structures 111 are positioned on the second side 110b of the semiconductor die 110 outside of (and/or around) the perimeter of the sensing unit 112 (or a sensing area thereof). Though the example interconnection structures 111 are shown surrounding the fingerprint sensing unit 112 (or sensing area) on two sides, any number of sides may be surrounded (e.g., four sides, two sides, three sides, one side, etc.). The example interconnection structures 111 are taller (e.g., from the second side 110b of the substrate 110) than any part of the sensing unit 112 on the semiconductor die 110 (e.g., electronic device elements, electrodes, traces, patterns, pads, lands, probes, etc.).

In general, block 1010 may comprise preparing a semiconductor die. Accordingly, the scope of this disclosure should not be limited by characteristics of any particular type of semiconductor die or of any particular manner of preparing a semiconductor die.

The example method 1000 may, at block 1020, comprise mounting the semiconductor die. Block 1020 may comprise mounting the semiconductor die (and/or other electronic components) in any of a variety of manners, non-limiting examples of which are provided herein.

Block 1020 may, for example, comprise mounting the semiconductor die to a substrate that comprises any of a variety of characteristics. For example, the substrate may comprise a circuit board material (e.g., FR-4 glass epoxy, G-10 woven glass and epoxy, FR-n with n=1 to 6, CEM-m with m=1 to 4, laminate, laminate thermoset resin, copper-clad laminate, resin impregnated B-state cloth (pre-preg), polytetrafluoroethylene, combinations thereof, equivalents thereof, etc.). The substrate may also, for example, be coreless. The substrate may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto. The substrate may, for example, comprise silicon or any of a variety of semiconductor materials. The substrate may also, for example, comprise a glass (e.g., glass, sapphire glass, reinforced glass, etc.) or metal plate (or wafer). The substrate may comprise any of a variety of configurations. For example, the substrate may be in wafer or panel form. The substrate may also, for example, be in diced or singulated form.

The substrate may, for example, be or comprise only a bulk material with no conductive routing paths. Alternatively for example, the substrate may comprise one or more conductive layers, vias, and or signal distribution structures. For example, the substrate may comprise conductive vias extending into the substrate from the top surface thereof to or toward the bottom surface thereof. Also for example, instead of (or in addition to) conductive vias extending straight through the substrate, the substrate may comprise conductive paths that extend between top and bottom surfaces of the substrate in an indirect path (e.g., in a conductive path comprising a combination of vertical and lateral conductive path segments or portions).

Block 1020 may, for example, comprise mounting (or attaching) the semiconductor die (e.g., as provided at block 1010) to the substrate in any of a variety of manners. For example, block 1020 may comprise mounting (or attaching)

the semiconductor die to the substrate utilizing the conductive interconnection structures provided (or formed) at block 1010. Note that in an example implementation in which the conductive interconnections are not provided (or formed) at block 1010, block 1020 may comprise forming such structures on the semiconductor die and/or on the substrate. Block 1020 may, for example, comprise mounting the semiconductor die to the substrate utilizing any of a variety of types of interconnection structures (e.g., conductive balls or bumps, solder balls or bumps, metal posts or pillars, copper posts or pillars, solder-capped posts or pillars, solder paste, conductive adhesive, etc.). Block 1020 may comprise mounting the electronic component(s) to the substrate utilizing any of a variety of bonding techniques (e.g., thermocompression (TC) bonding, thermocompression non-conductive paste (TCNCP) bonding, mass reflow, adhesive attachment, etc.). In an example implementation, block 1020 may comprise utilizing conductive bumps to electrically connect die bond pads (or traces, lands, patterns, etc.) of the semiconductor die to respective substrate bond pads (or traces, lands, patterns, etc.) of the substrate. Such die bond pads may, for example, be exposed through respective openings (or apertures) in a dielectric layer (or passivation layer) on the semiconductor die. Similarly, such substrate bond pads may, for example, be exposed through respective openings (or apertures) in a dielectric layer (or passivation layer) on the substrate.

Block 1020 may also, for example, comprise forming an underfill between the mounted semiconductor die and the substrate. The underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto. The underfill may be formed in any of a variety of manners (e.g., capillary underfilling, pre-applied underfilling of a liquid or paste or preformed sheet, molded underfilling, etc.). Such underfill may comprise any of a variety of characteristics (e.g., capillary underfill, pre-applied underfill, molded underfill, etc.). Note that in various example implementations, such underfill is not formed at block 1030 (e.g., never formed, formed at a later process step, etc.).

Figure 2B:
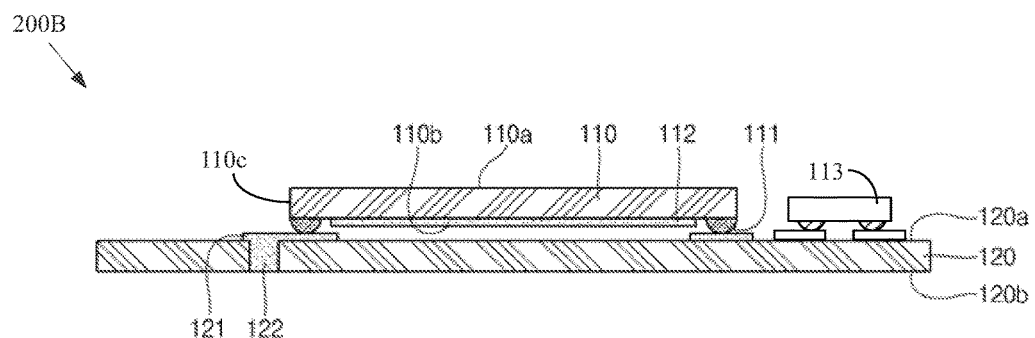

An example implementation 200B showing various aspects of block 1020 is shown at FIG. 2B. The example implementation 200B (or assembly, sub-assembly, package, etc.) comprises the semiconductor die 110, as discussed with regard to block 1010 and FIG. 2A. The bottom side 110b of the semiconductor die 110 is electrically and mechanically attached to the top side 120a of the substrate 120 with the conductive interconnection structures 111. In particular, the top side 120a of the substrate 120 has a substrate die pad and conductive trace 121 (or pattern, land, pad, etc.) to which the conductive interconnection structure 111 is connected. The example trace 121 is also connected to a conductive via 122 extending through the substrate from the top side 120a of the substrate 120 to the bottom side 120b of the substrate. Such a conductive via 122 may, for example, be utilized to connect the fingerprint sensor device to another circuit. Though the example implementation 200B is shown without underfill between the semiconductor die 110 and the substrate 120, an underfill may fill such space.

Note that although the examples provided herein generally concern mounting a single semiconductor die, any number of die and/or other electronic components may also be mounted. An example of a mounted second semiconductor die 113 is shown at FIG. 2B, but is omitted from the other figures for illustrative clarity.

In general, block 1020 may comprise mounting the semiconductor die. Accordingly, the scope of this disclosure should not be limited by characteristics of any particular type of semiconductor die or of any particular manner of mounting a semiconductor die.

The example method 1000 may, at block 1030, comprise forming an adhesive layer. Block 1030 may comprise forming the adhesive layer in any of a variety of manners, non-limiting examples of which are provided herein.

The adhesive layer may, for example, have a first side (e.g., a top planar surface, etc.), a second side (e.g., a bottom planar surface, etc.), and peripheral sides (e.g., lateral side surfaces, etc.) between the first and second sides. The second side (e.g., lower side) of the adhesive may, for example, directly contact and/or cover the first side (e.g., upper side) of the semiconductor die mounted at block 1020. The adhesive layer may, for example, comprise a uniform thickness and/or may cover the entire first side (e.g., top side) of the semiconductor die.

In an example implementation, the adhesive layer may be or comprise a non-conductive adhesive (e.g., comprising one or more dielectric materials) that electrically isolates the entire first side of the semiconductor die, for example providing for no electrically conductive paths between the first side of the semiconductor die and a component (e.g., a protective plate or layer, etc.) adhered to a side of the adhesive layer opposite the semiconductor die. The adhesive layer may, for example be sized to exactly match the area of the first side of the semiconductor die. Also, the area of the adhesive layer may be smaller than the first side of the conductive die, for example leaving a portion of the first side of the semiconductor die uncovered by the adhesive layer. Also for example, the area of the adhesive layer may be larger than the first side of the semiconductor die.

The adhesive layer may comprise any of a variety of characteristics. For example, the adhesive layer may comprise a liquid or paste, a preformed adhesive sheet or film, etc.

Block 1030 may comprise forming the adhesive layer in any of a variety of manners. For example, block 1030 may comprise forming the adhesive layer by photolithography, screen printing, dispensing and spreading or squeegeeing, printing, brushing, dipping, laminating a preformed sheet or film, etc.

Figure 2C:
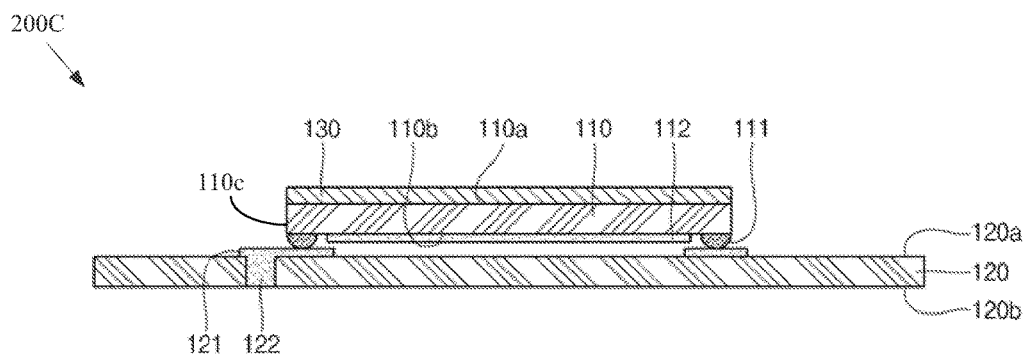

An example implementation 200C showing various aspects of block 1030 is shown at FIG. 2C. The example implementation 200C (or assembly, sub-assembly, package, etc.) comprises an adhesive layer 130 on (e.g., directly on, etc.) the top side 110a of the semiconductor die 110. The example adhesive layer 130 has a uniform thickness and is sized to exactly match (e.g., generally match to within engineering and/or manufacturing accuracy) the area of the top side 110a of the semiconductor die 110. The example adhesive layer 130 may, for example, comprise a solid layer of non-conductive adhesive, for example providing for no electrical conductive paths between the top side 110a of the semiconductor die 110 and a component (e.g., a protective plate or layer, etc.) adhered to a side of the adhesive layer 130 opposite the semiconductor die 110. In an alternative implementation, the adhesive layer 130 may comprise apertures (or openings) through which conductive contact may be made with another component.

In general, block 1030 may comprise forming an adhesive layer. Accordingly, the scope of this disclosure should not be limited by characteristics of any particular type of adhesive layer or of any particular manner of forming an adhesive layer.

The example method 1000 may, at block 1040, comprise attaching a protective plate. Block 1040 may comprise attaching the protective plate in any of a variety of manners, non-limiting examples of which are provided herein.

The protective plate (or layer) may comprise any of a variety of characteristics. The protective plate may, for example, protect the semiconductor die from external forces and/or contaminants (e.g., due to finger pressing, swiping, etc.). The protective plate may, for example, cover at least the first side of the semiconductor die. In an example implementation, the protective plate may have a larger area than the semiconductor die (e.g., overhanging the conductive die). Though the example protective plate may comprise a preformed plate of material (e.g., formed prior to attachment at block 1040), the scope of this disclosure is not limited thereto. For example, the protective plate may be formed as (or after) its material is formed on the adhesive layer 130.

The protective plate may comprise any one or more of a variety of materials. For example, the protective plate may comprise one or more of glass, sapphire, sapphire glass, reinforced glass, plastic, polycarbonate (PC), polyamide (PI), etc., but aspects of the present disclosure are not limited thereto. The protective plate may, for example, comprise a planar first side (e.g., a top surface, etc.), a planar second side (e.g., a bottom surface, etc.), and planar peripheral sides (e.g., lateral sides, etc.) between the first and second sides. The second side (e.g., bottom side) of the protective plate may, for example, be adhered to the first side (e.g., top side) of the adhesive layer.

Figure 2D:
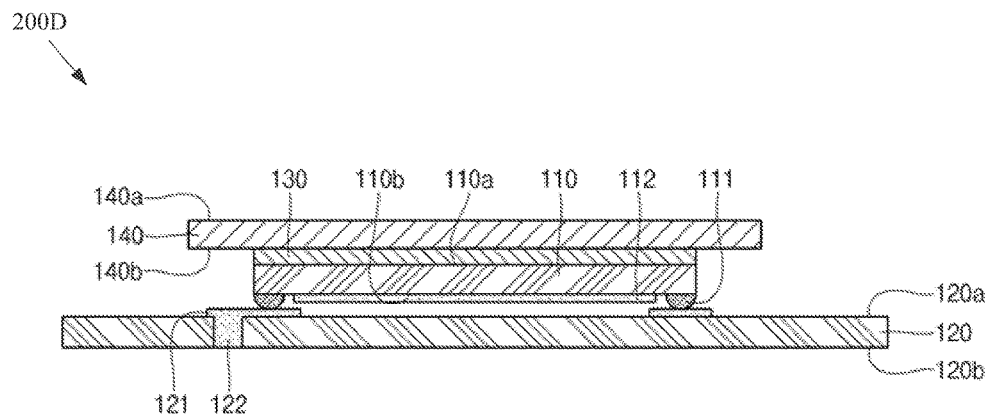

An example implementation 200D showing various aspects of block 1040 is shown at FIG. 2D. The example implementation 200D (or assembly, sub-assembly, package, etc.) comprises a protective plate 140, a bottom side 140*b* (or surface) (e.g., a portion thereof) is adhered to the top side (or surface) of the adhesive layer 130. A top side 140*a* (or surface) of the protective plate 140 is exposed, for example for contact with or at least being in close proximity with a finger being sensed. The example protective plate 140 is shown having an area that is substantially larger than the area of the semiconductor die 110 and the adhesive layer 130, for example overhanging the peripheral edges of the semiconductor die 110 and the adhesive layer 130.

In general, block 1040 may comprise attaching a protective plate. Accordingly, the scope of this disclosure should not be limited by characteristics of any particular type of protective plate or of any particular manner of attaching a protective plate.

The example method 1000 may, at block 1050, comprise attaching a bezel. Block 1010 may comprise attaching the bezel in any of a variety of manners, non-limiting examples of which are provided herein.

The bezel may, for example, be configured and attached to couple the protective plate to the substrate and/or to protect the peripheral edges of the protective plate. For example, the bezel may cover (e.g., at top and/or lateral and/or bottom sides) the protective plate attached to the semiconductor die at block 1040. In an example implementation, the bezel may only contact (or directly cover) the periphery of the first side (e.g., top side) of the protective plate. The bezel may also, for example, be attached to (e.g., adhered to, etc.) the first side 120*a* of the substrate 120. The bezel may, for example, surround the protective plate, adhesive layer, and semiconductor die on four, two, or any number of sides. The bezel may, for example, provide a cover for all components of the fingerprint sensor device, for example other than a perimeter region of the substrate (which may also be covered in various example implementations).

Figure 2E:
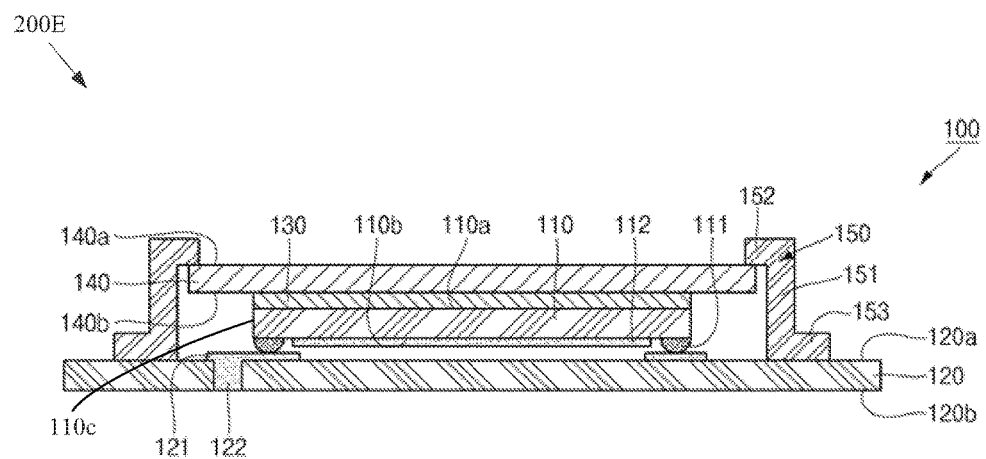

An example implementation 200E showing various aspects of block 1050 is shown at FIG. 2E. The example implementation 200E (or assembly, sub-assembly, package, etc.) comprises a bezel 150 that includes a main body part 151, an affixing part 152 (e.g., at an upper end of the bezel 150), and a base part 153 (e.g., at a lower end of the bezel 150). The example bezel 150 surrounds the lateral sides of the semiconductor die 110, the adhesive layer 130, and the protective plate 140. The example bezel 150 leaves the first side 140*a* (e.g., top side) of the protective plate 140 (or a central area thereof) exposed, for example for contact or close proximity with a finger. A bottom surface of the base part 153 is attached (e.g., adhered, etc.) to the top side 120*a* of the substrate 120. The main body part 151 couples the base part 153 and the affixing part 152 to each other. The affixing part 150 comprises a portion that extends inward toward the center of the semiconductor die 110. Such portion of the affixing part 152 extends over the periphery of the top side 140*a* of the protective plate 140. A bottom side of such bottom side of the affixing part 152 contacts and holds the protective plate 140 to the substrate 120.

In the example implementation 200E, there are no electrical conductors (e.g., fingerprint sense traces or elements or electrodes or patterns, etc.) above the upper side 110*a* of the semiconductor die. This need not be the case, however, as will be shown in other example implementations presented herein.

In general, block 1050 may comprise attaching a bezel. Accordingly, the scope of this disclosure should not be limited by characteristics of any particular type of bezel or of any particular manner of attaching a bezel.

The example method 1000 may, at block 1095, comprise continuing the manufacturing (or processing), if necessary. Block 1095 may comprise continuing the manufacturing (or processing) in any of a variety of manners, non-limiting examples of which are provided herein.

For example, block 1095 may comprise performing additional substrate processing functions, mounting additional electronic components to the substrate, attaching device interconnection structures to the substrate, encapsulating, covering, general packaging, testing, marking, shipping, integrating the fingerprint sensing device 100 into another product, etc. Also for example, block 1095 may comprise directing execution flow of the example method 1000 to any previous step of the example method 1000. Additionally for example, block 1095 may comprise directing execution flow of the example method 1000 to any other method disclosed herein (e.g., the example method 3000 of FIG. 3, the example method 5000 of FIG. 5, or any blocks or portions thereof, etc.). Further for example, block 1095 may comprise directing execution flow of the example method 1000 to any method, or portion thereof, that is not disclosed herein.

In general, block 1095 may comprise continuing the manufacturing (or processing). Thus, the scope of this disclosure should not be limited by characteristics of any particular manner or type of continued manufacturing (or processing).

As shown in the example implementation 200E shown in FIG. 2E, which may also be referred to herein as the fingerprint sensor device 100 (or package), an example fingerprint sensor device manufactured in accordance with the example method 1000 of FIG. 1 may sense a fingerprint based on a change in the capacitance when the finger (or fingerprint thereof) is touching or in close proximity to the top side 140*a* of the protection plate 140, which is on the top side 110*a* of the semiconductor die 110, which includes the plurality of first conductive bumps 111 and the fingerprint sensing unit 112 on its bottom side 110*b*. The fingerprint sensor device (or package) 100 may further include a flexible circuit board or other interconnection structure (not shown) electrically connected to conductive patterns of the substrate 120 (e.g., on the bottom 120*b* and/or top side 120*a* thereof). The flexible circuit board may, for example, be electrically connected to one or more input and/or output pads of the fingerprint sensor package 100 and also be electrically connected to an external substrate or an external electronic device. Since the example semiconductor die 110 is mounted on the substrate 120 in a flip chip configuration, the fingerprint sensor package 100 provides for a simplified manufacturing process relative to other configurations.

As stated herein, the scope of the present disclosure is not limited to the specific example method steps (or associated structures) discussed. For example, various blocks (or portions thereof) may be removed from or added to the example method 1000 of FIG. 1, various blocks (or portions thereof) may be reordered, various blocks (or portions thereof may be modified), etc. For example, in an example implementation, an encapsulating material may be utilized to surround the semiconductor die, the protective layer may be coated on the first side of the semiconductor die and/or on the encapsulating material, a bezel may be omitted, etc. Such example implementation is shown in FIGS. 3 and 4A-4B.

Figure 3:
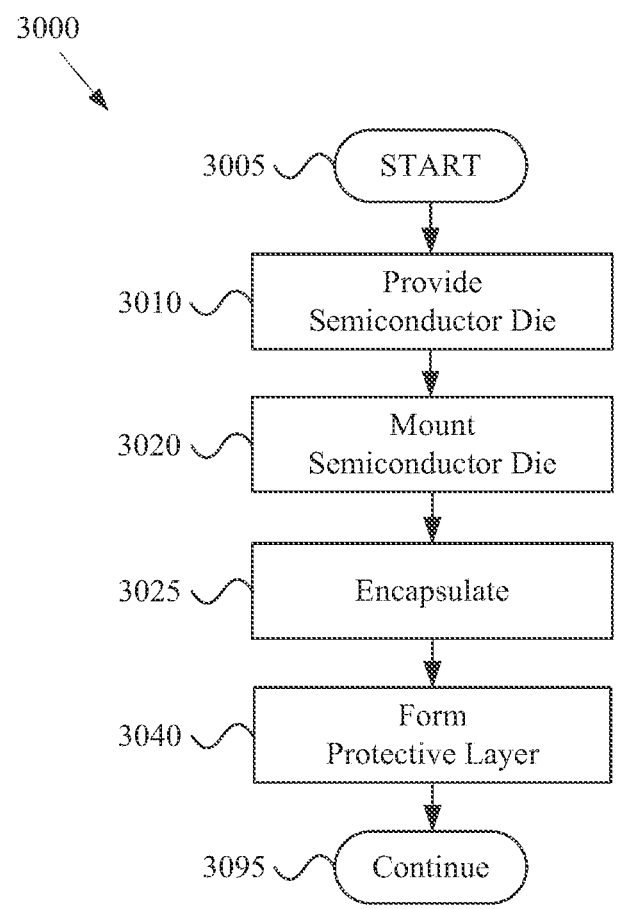
FIG. 3 shows a flow diagram of an example method of making a sensor device, in accordance with various aspects of the present disclosure.
Figure 4A:
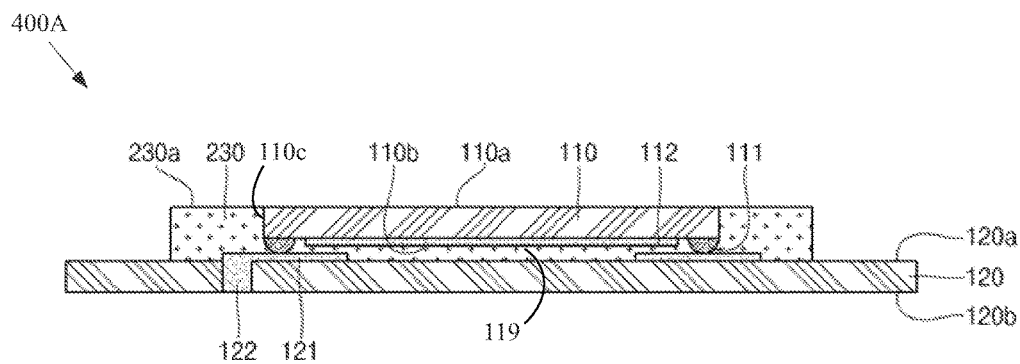
FIGS. 4A-4B show cross-sectional views illustrating example sensor devices and example methods of making sensor devices, in accordance with various aspects of the present disclosure.
Figure 4B:
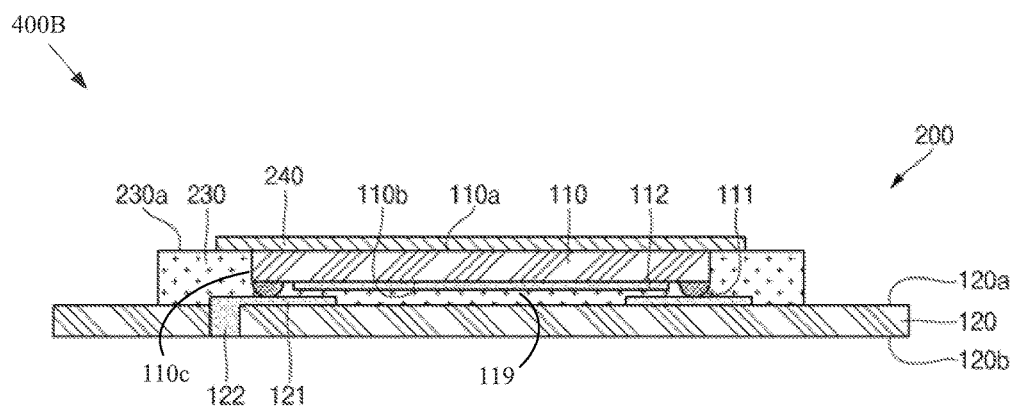

FIG. 3 shows a flow diagram of an example method 3000 of making a sensor device (e.g., a fingerprint sensor device), in accordance with various aspects of the present disclosure. The example method 3000 may, for example, share any or all characteristics with any other method discussed herein (e.g., the example method 1000 of FIG. 1, the example method 5000 of FIG. 5, etc.). FIGS. 4A-4B show cross-sectional views illustrating example sensor devices and example methods of making sensor devices, in accordance with various aspects of the present disclosure. The structures shown in 4A-4B may share any or all characteristics with analogous structures shown in FIGS. 2A-2E, FIGS. 6A-6E, FIGS. 7-9, etc. FIGS. 4A-4B may, for example, illustrate an example sensor device (e.g., a fingerprint sensor device) at various stages (or blocks) of the example method 3000 of FIG. 3. FIGS. 3 and 4A-4B will now be discussed together. It should be noted that the order of the example blocks (or portions thereof) of the example method 3000 may vary, various blocks (or portions thereof) may be omitted or added, and/or various blocks (or portions thereof) may be changed without departing from the scope of this disclosure.

In general, the example method 3000 may comprise providing a semiconductor die (block 3010), mounting the semiconductor die (block 3020), encapsulating (block 3025), and forming a protective layer (block 3040).

The example method 3000 may begin executing at block 3005. The example method 3000 may begin executing for any of a variety of reasons, non-limiting examples of which are provided herein. For example, the example method 3000 may begin executing for any or all of the reasons discussed herein with regard to the example method 1000 of FIG. 1. For example, block 3005 may share any or all characteristics with block 1005 of the example method 1000 of FIG. 1.

The example method 3000 may, at block 3010, comprise providing a semiconductor die. Block 1010 may comprise providing the semiconductor die in any of a variety of manners, non-limiting examples of which are provided herein. Block 3010 may, for example, share any or all characteristics with block 1010 of the example method 1000 of FIG. 1.

The example method 3000 may, at block 3020, comprise mounting the semiconductor die. Block 3020 may comprise mounting the semiconductor die in any of a variety of manners, non-limiting examples of which are provided herein. Block 3020 may, for example, share any or all characteristics with block 1020 of the example method 1000 of FIG. 1.

The example method 3000 may, at block 3025, comprise encapsulating. Block 3025 may comprise encapsulating (e.g., the semiconductor die, the substrate, etc.) in any of a variety of manners, non-limiting examples of which are provided herein.

Block 3025 may, for example, comprise forming encapsulating material that covers at least a first side or surface (e.g., a top side or surface) of the substrate to which the semiconductor die was mounted at block 3020. The encapsulating material may, for example, have a second side or surface (e.g., bottom side or surface) that covers the entire first side of the substrate (e.g., parts not already covered by the semiconductor die and/or interconnection structures), but may also cover only a portion of the substrate (e.g., leaving a peripheral portion, or ring, of the first side of the substrate exposed).

The encapsulating material may also, for example, cover and surround at least the peripheral sides or surfaces (e.g., lateral sides) of the semiconductor die. In an example implementation, the encapsulating material has a first side or surface (e.g., a top side or surface) that is coplanar with the first side or surface (e.g., top side or surface) of the semiconductor die. In an alternative implementation, however, the encapsulating material may cover the first side or the semiconductor die, or may be higher than the first side of the semiconductor die and comprise an aperture exposing the first side of the semiconductor die (or a portion thereof).

The encapsulating material may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The encapsulating material may, for example, comprise any one or more of polyimide (PI), benzocyclobutene (BCB), polybenzoxazole (PBO), bismaleimide-triazine (BT), phenolic resin, any of the dielectric materials discussed herein, etc.

Block 3025 may comprise forming the encapsulating material in any of a variety of manners (e.g., compression molding, transfer molding, liquid encapsulant molding, vacuum lamination, paste printing, film assisted molding, etc.). In an example implementation, block 3025 may comprise utilizing a sealed mold chase or film-assisted molding technique to keep the first side of the semiconductor die free of encapsulating material. In another example implementation, block 3025 may initially form the encapsulating material to cover the first side of the semiconductor die and then thin the encapsulating material until the first side of the semiconductor die is exposed from the encapsulating material. In still another example implementation, block 3025 may initially form the encapsulating material to cover the first side of the semiconductor die and then thin both the encapsulating material and the semiconductor die to thin both the encapsulating material and the semiconductor die to a desired thickness.

As discussed with regard to block 1020 of the example method 1000, an underfill may be formed between the semiconductor die and the substrate. As with block 1020, block 3020 may also have formed an underfill. In such case, the encapsulating material may also cover peripheral surfaces (e.g., lateral surfaces) of such underfill. In another example implementation, block 3025 may comprise underfilling the semiconductor die with the encapsulating material (e.g., as a molded underfill, etc.). An example underfill 119, which as explained above may for example be a molded underfill or another underfill different from the encapsulating material, is shown at FIG. 4A and FIG. 4B.

An example implementation 400A showing various aspects of block 3025 is shown at FIG. 4A. The components of the example implementation 400A (and the example implementation 400B) may, for example, share any or all characteristics with like-numbered components of the other example implementations shown and discussed herein, and thus a detailed discussion of such components will not be repeated.

The example implementation 400A (or assembly, sub-assembly, package, etc.) comprises an encapsulating material 230 that covers at least a portion of the first side 120a (e.g., top side, etc.) of the substrate 120. The example encapsulating material 230 also covers conductive traces 121 (or patterns, lands, pads, etc.) on or at the first side 120a of the substrate 120. The example encapsulating material 230 also covers and surrounds the lateral sides 110c of the semiconductor die 110. The example encapsulating material 230 also fills the volume between the bottom side 110b of the semiconductor die 110 and the top side 120a of the substrate 120 (e.g., as an underfill) and surrounds the conductive interconnection structures 111. The example encapsulating material 230 has a first side or surface 230a (e.g., a top side or surface) that is coplanar with the first side 110a of the semiconductor die 110a.

In general, block 3025 may comprise encapsulating. Accordingly, the scope of this disclosure should not be limited by characteristics of any particular type of encapsulating material or of any particular manner of encapsulating.

The example method 3000 may, at block 3040, comprise forming a protective layer. Block 3040 may comprise forming a protective layer (e.g., on the semiconductor die, on the encapsulating material, etc.) in any of a variety of manners, non-limiting examples of which are provided herein. Block 3040 may, for example, share any or all characteristics with block 1040 of the example method 1000 of FIG. 1. Note that the protective layer may also be referred to as a protection layer.

The protective layer (or plate) may comprise any of a variety of characteristics. The protective layer may, for example, protect the semiconductor die from external forces and/or contaminants (e.g., due to finger pressing, swiping, etc.). The protective layer may, for example, have a first side (e.g., a top side or surface) facing away from the semiconductor die, a second side (e.g., a bottom side or surface) facing the semiconductor die, and peripheral sides (e.g., lateral sides or surfaces) between the first and second sides. The protective layer may, for example, comprise a layer of uniform thickness. The protective layer may, for example, be positioned on or over the first side (e.g., top side) of the semiconductor die mounted at block 3020. The protective layer may, for example, cover the entire first side of the semiconductor die. The protective layer may also, for example, be positioned on or over the first side (e.g., top side) of the encapsulating material formed at block 3030. The protective layer may, for example, cover the entire first side of the encapsulating material or may only cover a portion of the first side of the encapsulating material around a periphery of the first side of the semiconductor die. For example, an outer perimeter of the top side of the encapsulating material may remain uncovered by the protective layer.

The protective layer may comprise any of a variety of materials. For example, the protective layer may be or comprise alumina ($Al_2O_3$), any variant thereof, or the like. Also for example, the protective layer may be or comprise a polymer. Generally, the protective layer may be or comprise any one or more of the various dielectric materials discloses herein. The protective layer may also, for example, share any or all characteristics with the protective plate discussed herein with regard to FIG. 1.

Block 3040 may comprise forming the protective layer in any of a variety of manners. For example, block 3040 may comprise forming a mask pattern to cover regions other than those intended to be covered by the protective layer. Block 3040 may then, for example, comprise applying the protective layer material to portions of the assembly that are not covered by the mask layer (e.g., a portion or all of the first side of the semiconductor die, a portion or all of the encapsulating material, etc.). In another example implementation, block 3040 may utilize selective printing or application without a mask layer to apply the protective layer. In still another example implementation, block 3040 may comprise forming the protective layer as a blanket layer over at least the entire first side of the semiconductor die, the entire top side and/or lateral sides of the encapsulating material, and/or the exposed top side of the substrate. In still another example implementation block 3040 may comprise applying and adhering a preformed plate or film of the protective layer material.

For example, in an example implementation in which the protective layer is or comprises a polymer, the block 3040 may comprise coating the polymer (e.g., utilizing any of the layer forming processes presented herein) and then curing the polymer (e.g., by applying heat, ultraviolet radiation, etc.). Also for example, in an example implementation in which the protective layer comprises a layer of alumina (or the like), block 3040 may comprise forming the alumina layer by particle impact (or mechanical impact), thermal spraying, plasma spraying, high-velocity oxygen-fuel (HVOF) spraying, etc.

An example implementation 400B showing various aspects of block 3040 is shown at FIG. 4B. The example implementation 400B (or assembly, sub-assembly, package, etc.) comprises a protective layer 240. The example protective layer 240 has a first side (e.g., a top side or surface) facing away from the semiconductor die 110, a second side (e.g., a bottom side or surface) facing the semiconductor die 110, and peripheral sides (e.g., lateral sides or surfaces) between the first and second sides. The example protective layer 240 covers the entire top side 110a of the semiconductor die, and covers the top side 230a of the encapsulating material 230 around a perimeter of the semiconductor die 110. An outer perimeter of the top side 230a of the encapsulating material 230 is not covered by the example protective layer 240, but may for example be covered in another example implementation.

In the example implementation 400B, there are no electrical conductors (e.g., fingerprint sense traces or elements or electrodes or patterns, etc.) above the upper side 110a of the semiconductor die. This need not be the case, however, as will be shown in other example implementations presented herein.

In general, block 3040 may comprise forming a protective layer. Accordingly, the scope of this disclosure should not be limited by characteristics of any particular type of protective layer or of any particular manner of forming a protective layer.

The example method 3000 may, at block 3095, comprise continuing the manufacturing (or processing), if necessary. Block 3095 may comprise continuing the manufacturing (or processing) in any of a variety of manners, non-limiting examples of which are provided herein. Block 3095 may, for example, share any or all characteristics with block 1095 of the example method 1000 of FIG. 1.

As shown in the example implementation 400B shown in FIG. 4B, and as also referred to herein as the fingerprint sensor device 200 (or package), an example fingerprint sensor device manufactured in accordance with the example method 3000 of FIG. 3, may sense a fingerprint based on a change in capacitance when the finger (or fingerprint thereof) is touching or in close proximity to the top side 140a of the protective layer 240, which is on the first side 110a of the semiconductor die 110, which includes the plurality of first conductive bumps 111 and the fingerprint sensing unit 112 on its bottom side 110b. The fingerprint sensor device (or package) 200 may further include a flexible circuit board or other interconnection structure (not shown) electrically connected to conductive patterns of the substrate 120 (e.g., on the bottom 120b and/or top side 120a thereof). The flexible circuit board may, for example, be electrically connected to one or more input and/or output pads of the fingerprint sensor package 200 and also be electrically connected to an external substrate or an external electronic device. Since the example semiconductor die 110 is mounted on the substrate 120 in a flip chip configuration, the fingerprint sensor package 200 provides for a simplified manufacturing process relative to other configurations.

Though various example implementations presented herein sense fingerprints through the semiconductor die, fingerprints may alternatively (or also) be performed through a substrate to which the semiconductor die is attached. An example implementation of such a configuration and methods for making thereof will now be presented.

Figure 5:
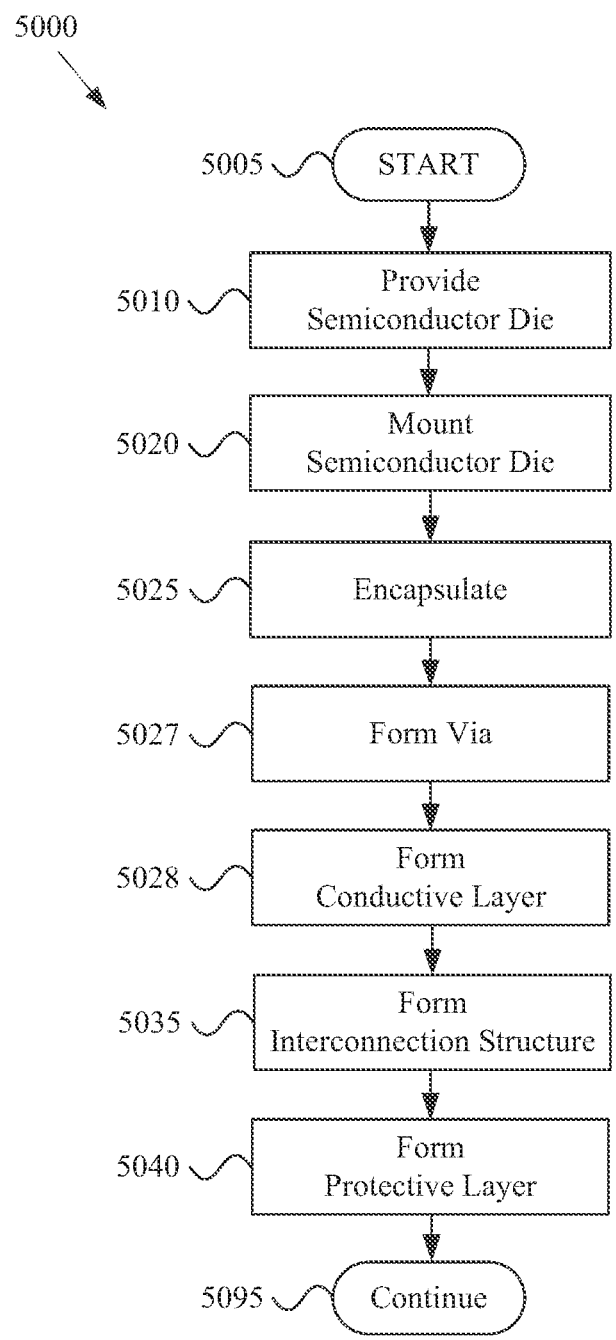
FIG. 5 shows a flow diagram of an example method of making a sensor device, in accordance with various aspects of the present disclosure.

FIG. 5 shows a flow diagram of an example method 5000 of making a sensor device (e.g., a fingerprint sensor device), in accordance with various aspects of the present disclosure. The example method 5000 may, for example, share any or all characteristics with any other method discussed herein (e.g., the example method 1000 of FIG. 1, the example method 3000 of FIG. 3, etc.). FIGS. 6A-6E show cross-sectional views illustrating example sensor devices and example methods of making sensor devices, in accordance with various aspects of the present disclosure. The structures shown in 6A-6E may share any or all characteristics with analogous structures shown in FIGS. 2A-2E, FIGS. 4A-4B, FIGS. 7-9, etc. FIGS. 6A-6E may, for example, illustrate an example sensor device (e.g., a fingerprint sensor device) at various stages (or blocks) of the example method 5000 of FIG. 5. FIGS. 5 and 6A-6E will now be discussed together. It should be noted that the order of the example blocks (or portions thereof) of the example method 5000 may vary, various blocks (or portions thereof) may be omitted or added, and/or various blocks (or portions thereof) may be changed without departing from the scope of this disclosure.

In general, the example method 5000 may comprise providing a semiconductor die (block 5010), mounting the semiconductor die (block 5020), encapsulating (block 5025), forming a via (block 5027), forming a conductive layer (block 5028), forming an interconnection structure (block 5035), and forming a protective layer (block 5040).

The example method 5000 may begin executing at block 5005. The example method 5000 may begin executing for any of a variety of reasons, non-limiting examples of which are provided herein. For example, the example method 5000 may begin executing for any or all of the reasons discussed herein with regard to the example method 1000 of FIG. 1. For example, block 5005 may share any or all characteristics with block 1005 of the example method 1000 of FIG. 1.

The example method 5000 may, at block 5010, comprise providing a semiconductor die. Block 5010 may comprise providing the semiconductor die in any of a variety of manners, non-limiting examples of which are provided herein. Block 5010 may, for example, share any or all characteristics with block 1010 of the example method 1000 of FIG. 1.

The example method 5000 may, at block 5020, comprise mounting the semiconductor die. Block 5020 may comprise mounting the semiconductor die in any of a variety of manners, non-limiting examples of which are provided herein. Block 5020 may, for example, share any or all characteristics with block 1020 of the example method 1000 of FIG. 1.

The example method 5000 may, at block 5025, comprise encapsulating. Block 3025 may comprise encapsulating (e.g., the semiconductor die, the substrate, etc.) in any of a variety of manners, non-limiting examples of which are provided herein. Block 5025 may, for example, share any or all characteristics with block 3025 of the example method 3000 of FIG. 3.

As mentioned in the discussion of block 3025, the encapsulating material may be formed in a manner that leaves the first side (e.g., a top side or surface, etc.) of the semiconductor die exposed, or in a manner that covers the first side of the semiconductor die. In the example implementation of block 5025 discussed herein, the encapsulating material is formed to cover the first side of the semiconductor die (e.g., to cover the entire first side of the semiconductor die).

Figure 6A:
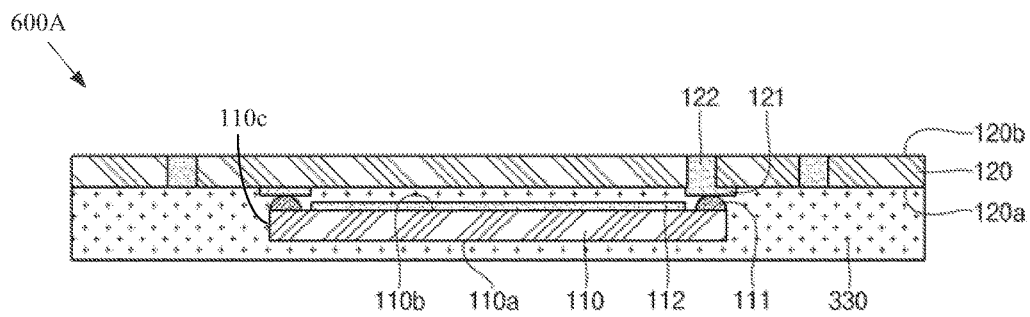
FIGS. 6A-6E show cross-sectional views illustrating example sensor devices and example methods of making sensor devices, in accordance with various aspects of the present disclosure.

An example implementation 600A showing various aspects of block 5025 is shown at FIG. 6A. The components of the example implementation 600A may, for example, share any or all characteristics with like-numbered components of the other example implementations shown and discussed herein, and thus a detailed discussion of such components will not be repeated. Note that relative to various other drawings presented herein (e.g., with regard to FIGS. 2A-2E, FIGS. 4A-4B, FIGS. 7-8, etc.), FIGS. 6A-6E are generally shown inverted. The numbering of like components has, however, been maintained.

Note that, as with all like numbered elements herein, the substrate 120 of the example implementation 600A may share any or all characteristics with the substrate of FIG. 1 (e.g., the substrate 120 of the example implementation 200B of FIG. 2B) discussed herein. For example, in an example implementation, the substrate 120 may be or comprise glass and/or any of a variety of materials, and/or may have a thickness and/or electrical permeability configured to permit fingerprint-related capacitance (or capacitance variations) to be measured therethrough (e.g., at the sensing area 112).

The example implementation 600A (or assembly, subassembly, package, etc.) comprises an encapsulating material 330 that covers the first side 120a of the substrate 120. Note that the encapsulating material 330 may share any or all characteristics with other encapsulating materials disclosed herein (e.g., the example encapsulating material 230 of FIGS. 4A-4B, etc.).

The example encapsulating material 330 also covers conductive traces 121 (or patterns, lands, pads, etc.) on or at the first side 120a of the substrate 120. The example encapsulating material 330 additionally covers and surrounds the peripheral sides 110c of the semiconductor die 110. The example encapsulating material 330 further fills the volume between the semiconductor die 110 (e.g., the second side 110b thereof) and the substrate 120 (e.g., the first side 120a thereof), for example as an underfill, and surrounds the conductive interconnection structures 111. Note, however, that in an example implementation, the volume between the semiconductor die 110 and the substrate 120 may remain empty (e.g., apart from the interconnection structures 111, if formed). In another example implementation, the volume between the semiconductor die 110 and the substrate 120 may be filled by an underfill material different than encapsulating material 330.

In general, block 5025 may comprise encapsulating. Accordingly, the scope of this disclosure should not be limited by characteristics of any particular type of encapsulating material or of any particular manner of encapsulating.

The example method 5000 may, at block 5027, comprise forming a via. Block 5027 may comprise forming one or more vias (e.g., through the encapsulating material formed at block 5025, etc.) in any of a variety of manners, non-limiting examples of which are provided herein. The via(s) may also be referred to as through hole(s).

The via(s) may, for example, extend through (e.g., entirely through, etc.) the encapsulating material. For example, the via(s) may extend from the first side or surface of the encapsulating material to the second side or surface of the encapsulating material. For example, a via may extend from the first side of the encapsulating material to a pattern (or trace, or land, or pad, or via stop, etc.) on the first side of the substrate, which is exposed through the encapsulating material by the via.

Block 5027 may, for example, comprise forming the via(s) by ablating the vias (e.g., laser ablating, plasma ablating, mechanical ablating or drilling, etc.). Block 5027 may also, for example, comprise forming the via(s) utilizing chemical etching or dissolving. Additionally for example, block 5027 may be combined with block 5027 to form the vias while the encapsulating is being performed (e.g., utilizing masking, mold chase features, etc., to form the vias while the encapsulating material is being formed).

Figure 6B:
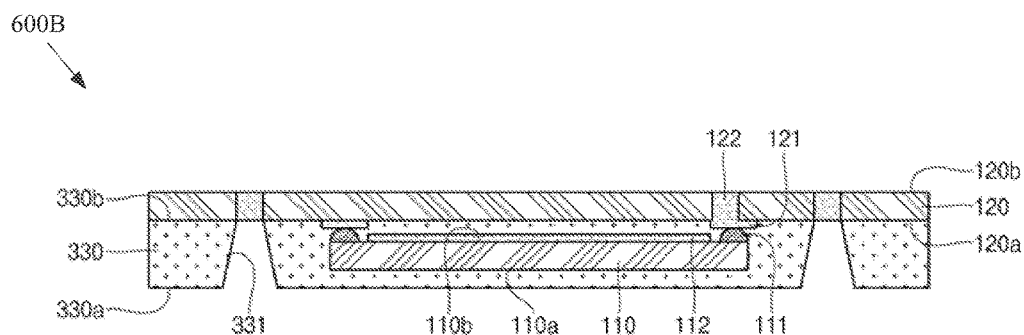

An example implementation 600B showing various aspects of block 5027 is shown at FIG. 6B. The example implementation 600B (or assembly, sub-assembly, package, etc.) comprises vias 331 (or through holes) through the encapsulating material 330. The example vias 331 extend from the first side 330a of the encapsulating material 330 to the second side 330b of the encapsulating material 330 and expose a conductive trace 121 (or conductive via 122) of the substrate 120. The example vias 331 are shown bounded by sloped interior sides of the encapsulating material 330. For example, the example vias 331 are wider at the first surface 330a of the encapsulating material 330 than at the second surface 330b of the encapsulating material. Such shape may advantageously enhance the later formation of a conductive layer or filler. The example vias 331 may also have straight sides (e.g., orthogonal to the first 330a and second 330b surfaces of the encapsulating material 330).

In general, block 5027 may comprise forming one or more vias. Accordingly, the scope of this disclosure should not be limited by characteristics of any particular type of via (or through hole) or any manner of forming a via.

The example method 5000 may, at block 5028, comprise forming a conductive layer. Block 5028 may comprise forming a conductive layer in any of a variety of manners, non-limiting examples of which are provided herein.

The conductive layer may, for example, comprise a pattern that includes any of a variety of characteristics. For example, the conductive layer may comprise traces, pads, lands, via hole lining or filler, etc. The conductive layer may also be referred to as a redistribution layer.

The conductive layer may, for example, comprise a conductive via portion that fills or lines the via(s) formed at block 5027. A conductive via portion may, for example, be formed on and/or electrically connected to a pattern of the substrate exposed through the encapsulating material by the via. In an example implementation, the conductive via portion of the conductive layer may line the walls of the encapsulating material that bound (or define) the via. A cavity may then remain that is bounded (or defined) by the conductive layer lining. Such cavity may be left unfilled, filled with a dielectric material, filled with a conductive material (e.g., material different from the conductive layer material, for example a solder material, conductive epoxy, etc.), etc. In another example implementation the conductive layer may completely fill the via.

The conductive layer may also, for example, comprise a conductive land portion (or pad, trace, pattern, etc.) on which an interconnection structure may be formed (e.g., at block 5035). The conductive layer may further, for example, comprise a conductive trace portion that extends between the conductive via portion and the conductive land portion.

The conductive layer may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Figure 6C:
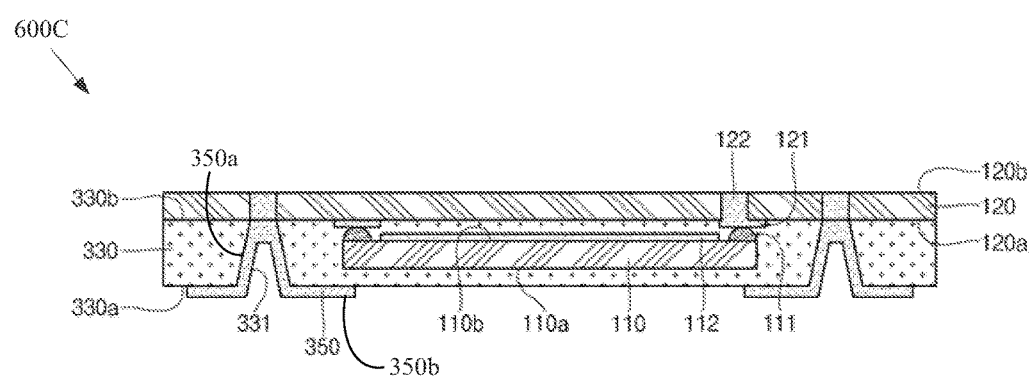

Block 5028 may, for example, comprise forming (or depositing) the conductive layer utilizing any one or more of a variety of processes (e.g., electrolytic plating, electroless plating, chemical vapor deposition (CVD), sputtering or physical vapor deposition (PVD), atomic layer deposition (ALD), plasma vapor deposition, printing, screen printing, lithography, etc.), but the scope of the present disclosure is not limited thereto An example implementation 600C showing various aspects of block 5028 is shown at FIG. 6C. The example implementation 600C (or assembly, sub-assembly, package, etc.) comprises a conductive layer 350 comprising a conductive via portion 350a of which is on the conductive trace 121 (or conductive via 122) of the substrate 120 exposed by the via 331 through the encapsulating material 330, and which also lines the walls of the encapsulating material 330 that bound (or define) the via 331, leaving a cavity that may or may not be filled. The example conductive layer 350 also comprises a conductive land portion 350b on the first side 330a of the encapsulating material 330, on which an interconnection structure may be formed (e.g., at block 5035). The example conductive via portion 350a and the conductive land portion 350b are electrically connected by a conductive trace portion of the conductive layer 350.

Though the example implementation 600C only shows a single conductive layer, the scope of the present disclosure is not limited thereto. For example, any number of conductive and/or dielectric layers may be formed to construct a multilayer signal distribution structure.

In general, block 5028 may comprise forming a conductive layer. Accordingly, the scope of this disclosure should not be limited by characteristics of any particular type of conductive layer (or pattern) or of any manner of forming a conductive layer (or pattern).

The example method 5000 may, at block 5035, comprise forming a conductive interconnection structure. Block 5035 may comprise forming one or more conductive interconnection structures in any of a variety of manners, non-limiting examples of which are provided herein.

As discussed herein, the conductive layer formed at block 5028 may comprise a conductive land portion on which a conductive interconnection structure may be formed. The conductive interconnection structure formed on (or attached to) the conductive land portion may be or comprise any of a variety of different types of conductive interconnection structures (e.g., conductive balls or bumps, solder balls or bumps, metal posts or pillars, copper posts or pillars, solder-capped posts or pillars, solder paste, conductive adhesive, etc.). In an example implementation, the conductive interconnection structure may be coupled to the conductive land portion of the conductive layer, which in turn is coupled to the conductive pattern of the substrate, which in turn is coupled to another conductive interconnection structure, which in turn is coupled to a bond pad of the semiconductor die. The conductive interconnection structure may, for example, provide for a connection between the fingerprint sensor device and another circuit (e.g., a motherboard, a flex circuit or other cable, a substrate of a multi-chip module, etc.).

Block 5035 may, for example, comprise forming the conductive interconnection structure(s) in any of a variety of manners, non-limiting examples of which were provided in the discussion of block 1010 of the example method 1000 of FIG. 1, though the scope of this disclosure is not limited thereto. Such conductive interconnection structure(s) may, for example, be the same type of conductive interconnection structure(s) utilized to connect the semiconductor die to the substrate, or may be different types of conductive interconnection structure(s).

Figure 6D:
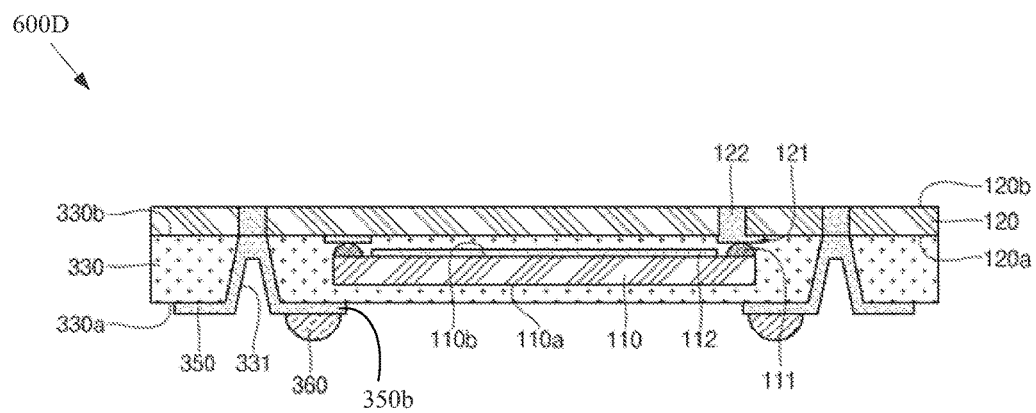

An example implementation 600D showing various aspects of block 5035 is shown at FIG. 6D. The example implementation 600D (or assembly, sub-assembly, package, etc.) comprises conductive interconnection structures 360 (e.g., conductive bumps) formed on the conductive land portion 350b of the conductive layer 350. The conductive land portion 350b of the conductive layer is, in turn, is coupled to the conductive pattern 121 of the substrate 120, which is turn is coupled to the conductive interconnection structure 111, which in turn is coupled to the semiconductor die 110.

In general, block 5035 may comprise forming a conductive interconnection structure. Accordingly, the scope of this disclosure should not be limited by characteristics of any particular type of conductive interconnection structure or of any manner of forming a conductive interconnection structure.

The example method 5000 may, at block 5040, comprise forming a protective layer. Block 5040 may comprise forming the protective layer in any of a variety of manners, non-limiting examples of which are provided herein. Block 5040 may, for example, share any or all characteristics with block 3040 of the example method 3000 of FIG. 3 and/or with block 1040 of the example method 1000 of FIG. 1.

The protective layer (or plate) may comprise any of a variety of characteristics. The protective layer may, for example, protect the substrate (or semiconductor die) from external forces and/or contaminants (e.g., due to finger pressing, swiping, etc.). The protective layer may, for example, have a first side or surface facing the substrate, a second side or surface facing away from the substrate, and peripheral sides or surfaces between the first and second sides. The protective layer may, for example, comprise a layer of uniform thickness. The protective layer may, for example, be positioned on or over the second side of the substrate. The protective layer may, for example, cover the entire second side of the substrate.

The protective layer may comprise any of a variety of materials. For example, the protective layer may be or comprise alumina (Al2O3), any variant thereof, or the like. Also for example, the protective layer may be or comprise a polymer. Generally, the protective layer may be or comprise any one or more of the various dielectric materials discloses herein. The protective layer may also, for example, share any or all characteristics with the protective plate discussed herein with regard to FIG. 1 and/or with the protective layer discussed herein with regard to FIG. 3.

Block 5040 may comprise forming the protective layer in any of a variety of manners. For example, block 5040 may comprise forming a mask pattern to cover regions other than those intended to be covered by the protective layer. Block 5040 may then, for example, comprise applying the protective layer material to portions of the assembly that are not covered by the mask layer (e.g., a portion or all of the second side of the substrate, etc.). In another example implementation, block 5040 may comprise utilizing selective printing or application without a mask layer to apply the protective layer. In still another example implementation, block 5040 may comprise forming the protective layer as a blanket layer over at least the entire second side of the substrate. In still another example implementation block 5040 may comprise applying and adhering a preformed plate or film of the protective layer material.

For example, in an example implementation in which the protective layer is or comprises a polymer, the block 5040 may comprise coating the polymer (e.g., utilizing any of the layer forming processes presented herein) and then curing the polymer (e.g., by applying heat, ultraviolet radiation, etc.). Also for example, in an example implementation in which the protective layer comprises a layer of alumina (or the like), block 5040 may comprise forming the alumina layer by particle impact (or mechanical impact), thermal spraying, plasma spraying, high-velocity oxygen-fuel (HVOF) spraying, etc.

Figure 6E:
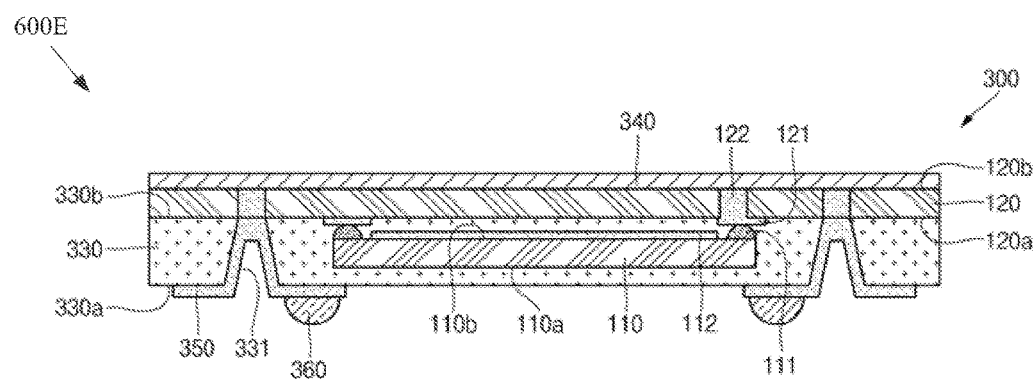

An example implementation 600E showing various aspects of block 5040 is shown at FIG. 6E. The example implementation 600E (or assembly, sub-assembly, package, etc.) comprises a protective layer 340. The example protective layer 340 has a first side or surface facing toward the substrate 120, a second side or surface facing away from the substrate 120, and peripheral sides or surfaces between the first and second sides. The example protective layer 340 covers the entire second side 120b of the substrate 120. The peripheral sides of the example protective layer 340 are coplanar with the peripheral sides of the substrate 120 and encapsulating material 330.

Note that, as with all of the blocks discussed herein, block 5040 may be performed at a wafer or panel level. For example, block 5040 may comprise forming the protective layer on a plurality of fingerprint sensor devices in a same procedure, where such devices may be singulated (or excised) later.

In general, block 5040 may comprise forming a protective layer. Accordingly, the scope of this disclosure should not be limited by characteristics of any particular type of protective layer or of any particular manner of forming a protective layer.

The example method 5000 may, at block 5095, comprise continuing the manufacturing (or processing), if necessary. Block 5095 may comprise continuing the manufacturing (or processing) in any of a variety of manners, non-limiting examples of which are provided herein. Block 5095 may, for example, share any or all characteristics with block 1095 of the example method 1000 of FIG. 1 As discussed herein, any of a variety of the example method blocks and/or associated structures may change without departing from the scope of this disclosure. For example, referring to the example method 1000 shown in FIG. 1 and discussed herein, block 1040 comprised attaching a protective plate. The example protective plate discussed with regard to FIGS. 1 and 2A-2E had no circuitry. The protective plate may, however, comprise electrical circuitry. Such electrically circuitry may, for example, comprise one or more conductive layers comprising traces, pads, lands, etc. Such conductive layers may, for example, be on an outer surface of the protective plate and/or may be internal to the protective plate (e.g., in a layered or laminated structure). Such electrically circuitry may also, for example, comprise active and/or passive circuit components. In an example implementation, such electrical circuitry may also comprise processing circuitry that processes fingerprint-related information sensed by the semiconductor die.

In an example implementation the conductive layer(s) and/or electrical components of the protective plate may be electrically coupled to the substrate utilizing one or more conductive interconnection structures that extend between a conductive layer (e.g., a pad, land, trace, pattern, etc.) of the protective plate and a conductive layer (e.g., a pad, land, trace, patter, etc.) of the substrate. The conductive interconnection structure (or the formation thereof) may, for example, share any or all characteristics with any of the conductive interconnection structures discussed herein (or the formation thereof). The conductive interconnection structure (or plurality thereof) may, for example, comprise a conductive bump or ball (e.g., solder bump or ball, etc.), a metal post or pillar (e.g., copper post or pillar), a stack of conductive bumps or balls, a copper core solder ball, etc. The conductive interconnection structure may, for example, be positioned outside the perimeter of the semiconductor die. For example, a plurality of the conductive interconnection structures may surround the semiconductor die on any number of sides (e.g., four sides, two sides, three sides, one side, etc.).

Figure 7:
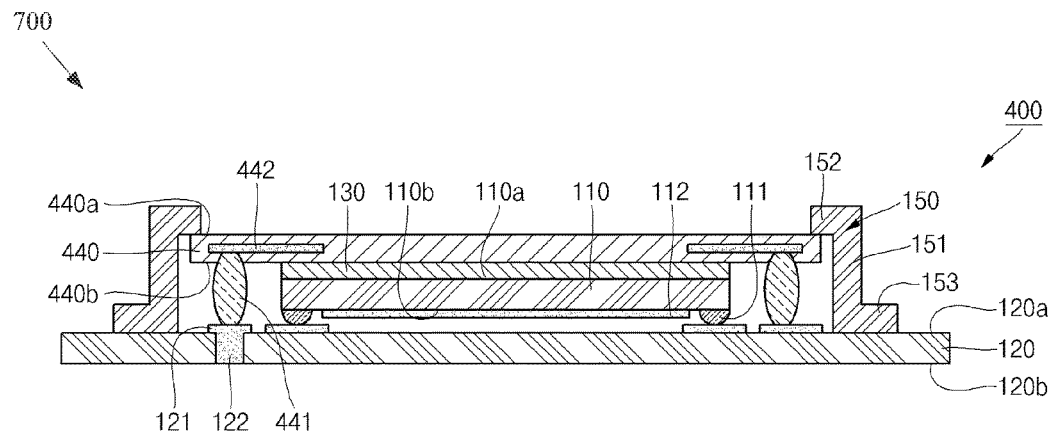
FIG. 7 shows a cross-sectional view illustrating an example sensor device and example methods of making a sensor device, in accordance with various aspects of the present disclosure.

An example implementation 700 showing various aspects of the modified block 1040 is shown at FIG. 7, which shows a cross-sectional view illustrating an example implementation 700, in accordance with various aspects of the present disclosure. The example implementation 700 may also be referred to as a fingerprint sensor device 400.

The example implementation 700 (or assembly, subassembly, package, etc.) may share any or all characteristics with the example implementation 200E shown in FIG. 2E and discussed herein. In general, this discussion will focus on the differences between such example implementations.

In the example implementation 700, the protective plate 440 has a first side 440a (e.g., a top side or surface), a second side 440b (e.g., a bottom side or surface), and peripheral sides (e.g., lateral sides or surfaces) between the first side 440a and the second side 440b. The example protective plate 440 comprises a conductive layer 442 (e.g., one or more traces, pads, lands, patterns, electronic devices, electronic circuits, logic circuits, processing circuits, fingerprint sensing electrodes, grounding traces, etc.). Conductive layer 442 can be located at first side 440a and/or at second side 440b of protective plate 440, and/or therebetween. The conductive layer 442 of the protective plate 440 is coupled to a conductive trace 121 and/or conductive via 122 of the substrate 120 utilizing a conductive interconnection structure 441. The conductive interconnection structure 441 may, for example, be connected to the conductive layer 442 of the protective plate 440 and/or to the conductive trace 121 and/or conductive via 122 of the substrate 120 by reflow, plating, direct metal-to-metal coupling without reflow, conductive epoxy, any of the bonding techniques discussed herein, etc. In an example implementation, a plurality of the conductive interconnection structures 441 are positioned around an outer perimeter of the semiconductor die 110 (e.g., outside of a footprint of the semiconductor die 110), surrounding any number of sides of the semiconductor die 110 (e.g., four sides, two sides, three sides, one side, etc.).

Note that the position of the conductive layer 442, as shown in FIG. 7, is outside the foot print of the sensing area 112 of the semiconductor die 110. This need not be the case however. For example, when the conductive layer 442 is assisting with the fingerprint sensing activity (e.g., when the conductive layer 442 comprises fingerprint sensing electrodes, etc.) various portions of the conductive layer 442 may be positioned over the sensing area 112.

The conductive layer 442 of the protective plate 440 may, for example, be electrically connected to the semiconductor die 110 through the interconnection structure 441, conductive trace 121, and interconnection structure 111. The conductive layer 442 may also, for example, be connected to another circuit through the interconnection structure 441, conductive trace 121, and conductive via 122.

In the example implementation 700, for example as with the example implementation 200E and other example implementations discussed herein, the fingerprint sensing unit 112 may for example sense fingerprints through the semiconductor die 112, the adhesive layer 130, and the protective plate 440. Also note that the protective plate 440 may, as part of conductive layer 442 or otherwise, include fingerprint sensing electrodes that are electrically coupled to the fingerprint sensing unit 112 through the interconnection structures 441, conductive traces 121 and interconnection structures 111.

Note that although the protective plate 440 is shown coupled to the semiconductor die 110 with an adhesive layer 130, and coupled to the substrate with the interconnection structures 441 and/or bezel 150, one or more of such couplings may be omitted.

As another example implementation in which one or more method blocks and/or associated structures may change, and/or various method blocks may be added or omitted, without departing from the scope of this disclosure, an interposer may be placed between the semiconductor die and the protective plate (or layer). For example, in comparison to the example implementation 700 shown in FIG. 7 and discussed herein, an interposer may comprise the electrical circuitry discussed herein with regard to the example protective plate (e.g., instead of the protective plate, in addition to the protective plate, etc.). The interposer may then be attached to the semiconductor die and/or the substrate in the same manner as that discussed with regard to the example protective plate of FIG. 7. A protective plate (e.g., like the protective plate (or layer) discussed with regard to FIGS. 1, 3, 5, 7, etc.) may then be attached (or formed) over the interposer.

The interposer may comprise any of a variety of characteristics. For example, the interposer may comprise any or all of the characteristics discussed herein with regard to the substrate 120.

Figure 8:
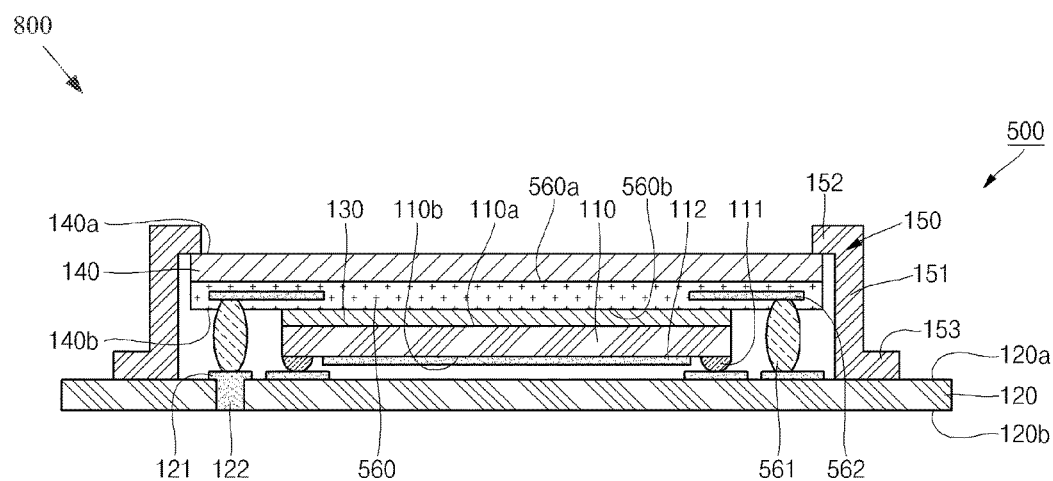
FIG. 8 shows a cross-sectional view illustrating an example sensor device and example methods of making a sensor device, in accordance with various aspects of the present disclosure.

The example implementation 800 is shown at FIG. 8, which shows a cross-sectional view illustrating the example implementation 800, in accordance with various aspects of the present disclosure. The example implementation 800 may also be referred to as a fingerprint sensor device 500.

The example implementation 800 (or assembly, sub-assembly, package, etc.) may share any or all characteristics with the example implementation 200E shown in FIG. 2E and discussed herein, with the example implementation 400B shown in FIG. 4B and discussed herein, with the example implementation 700 shown in FIG. 7 and discussed herein, etc. In general, this discussion will focus on the differences between such example implementations.

In the example implementation 800, the interposer 560 has a first side 560a (e.g., a top side or surface), a second side 560b (e.g., a bottom side or surface), and peripheral sides (e.g., lateral sides or surfaces) between the first side 560a and the second side 560b. The example interposer 560 comprises a conductive layer 562 (e.g., one or more traces, pads, lands, patterns, electronic devices, electronic circuits, logic circuits, processing circuits, fingerprint sensing electrodes, grounding traces, etc.). Conductive layer 562 can be located at first side 560a and/or at second side 560b of interposer 560, and/or therebetween. The conductive layer 562 of the interposer 560 is coupled to a conductive trace 121 and/or via 122 of the substrate 120 utilizing a conductive interconnection structure 561. The conductive interconnection structure 561 may, for example, be connected to the first conductive layer 562 of the interposer 560 and/or to the conductive trace 121 and/or via 122 of the substrate 120 by reflow, plating, direct metal-to-metal coupling without reflow, conductive epoxy, any of the bonding techniques discussed herein, etc.

Note that the position of the conductive layer 562, as shown in FIG. 8, is outside the foot print of the sensing area 112 of the semiconductor die 110. This need not be the case, however. For example, when the conductive layer 562 is assisting with the fingerprint sensing activity (e.g., when the conductive layer 562 comprises fingerprint sensing electrodes, etc.) various portions of the conductive layer 562 may be positioned over the sensing area 112.

The conductive layer 562 of the interposer 560 may, for example, be electrically connected to the semiconductor die 110 through the interconnection structure 561, conductive trace 121, and interconnection structure 111. The conductive layer 562 may also, for example, be connected to another circuit through the interconnection structure 561, conductive trace 121, and conductive via 122.

A protective plate 140, for example as discussed with regard to block 1040 of the example method 1000, may then be attached to the first side 560a (e.g., top side or surface) of the interposer 560. Such attachment may, for example, be perform utilizing an adhesive layer (not shown), utilizing the mechanical coupling provided by the bezel 151, or any of a variety of coupling techniques.

In the example implementation 800, the fingerprint sensing unit 112 may for example sense fingerprints through the semiconductor die 110, the adhesive layer 130, the interposer 560, and the protective plate 140. Also note that the interposer 560 may, as part of conductive layer 562 or otherwise, include fingerprint sensing electrodes that are electrically coupled to the fingerprint sensing unit 112 through the interconnection structures 561, conductive traces 121 and interconnection structures 111.

As another example implementation in which one or more method blocks and/or associated structures may change, and/or various method blocks may be added or omitted, without departing from the scope of this disclosure, the orientation of the semiconductor die may be inverted in any or all of the example implementations disclosed herein. For example, in comparison to the example implementation 700 shown in FIG. 7 and discussed herein, the semiconductor die may be inverted. Thus, instead of being attached to the substrate utilizing the conductive interconnection structures and attached to the protective plate utilizing an adhesive layer, the semiconductor die may be attached to the substrate utilizing an adhesive layer and attached to the protective plate (or to the interposer of the example implementation 800 shown in FIG. 8) utilizing the conductive interconnection structures.

Figure 9:
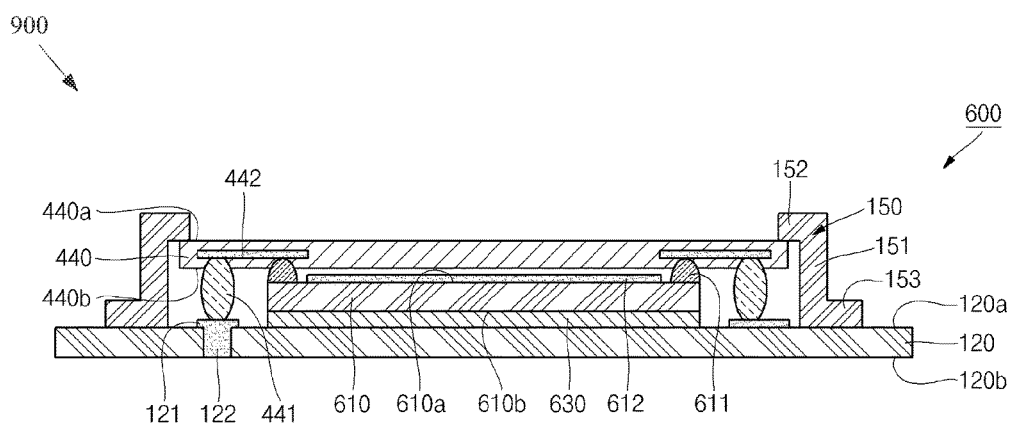
FIG. 9 shows a cross-sectional view illustrating an example sensor device and example methods of making a sensor device, in accordance with various aspects of the present disclosure.

The example implementation 900 is shown at FIG. 9, which shows a cross-sectional view illustrating the example implementation 900, in accordance with various aspects of the present disclosure. The example implementation 900 may also be referred to as the fingerprint sensor device 600.

The example implementation 900 (or assembly, sub-assembly, package, etc.) may share any or all characteristics with the example implementation 200E shown in FIG. 2E and discussed herein, with the example implementation 700 shown in FIG. 7 and discussed herein, etc. In general, this discussion will focus on the differences between such example implementations.

In the example implementation 900, relative to the example implementations 200E, 400B and 700, the semiconductor die 610 is mounted to the first side 120a of the substrate 120 with a back side 610b down and a front side 610a (e.g., the side that includes the sensing unit 612 (or area)) up. The semiconductor die 610 may share any or all characteristics with any of the example semiconductor dies discussed herein (e.g., the semiconductor die 110, etc.).

The adhesive layer 630 may share any or all characteristics with any of the adhesive layers discussed herein (e.g., the adhesive layer 130, etc.). As shown in FIG. 9, the top side of the adhesive layer 630 is adhered to the bottom side 610b of the semiconductor die 610, and the bottom side of the adhesive layer 630 is adhered to the top side 120a of the substrate 120. In the example implementation 900, there is no direct electrical connection between the first side 120a of the substrate 120 and the second side 610b of the semiconductor die 610. Note however, that an alternative implementation may utilize a conductive adhesive layer 630 for ground signal transfer to the semiconductor die 610, to enhance heat transfer, etc. In another alternative implementation, adhesive layer 630 may be omitted.

As with the example implementation 700 of FIG. 7, the example implementation 900 includes a protective plate 440 that comprises a conductive layer 442 (e.g., one or more traces, pads, patterns, or lands; electronic devices, electronic circuits, logic circuits, processing circuits, fingerprint sensing electrodes, grounding traces, etc.). Conductive layer 442 can be located at first side 440a and/or at second side 440b of interposer protective plate 440, and/or therebetween. The conductive layer 442 of the protective plate 440 is coupled to a conductive trace 121 and/or conductive via 122 of the substrate 120 utilizing a conductive interconnection structure 441. The conductive interconnection structure 441 may, for example, be connected to the conductive layer 442 of the protective plate 440 and/or to the conductive trace 121 and/or conductive via 122 of the substrate 120 by reflow, plating, direct metal-to-metal coupling without reflow, conductive epoxy, any of the bonding techniques discussed herein, etc.

In the example implementation 900, the semiconductor die 630 (e.g., a bond pad thereof) is coupled to the conductive layer 442 of the protective plate 440 utilizing one or more conductive interconnection structures 611. The conductive interconnection structures 611 may, for example, share any or all characteristics with the conductive interconnection structures 111 discussed herein.

The semiconductor die 610 (e.g., a bond pad thereof) may be electrically connected to the substrate 120 through the interconnection structure 611, the conductive layer 442 of the protective plate 440, and the interconnection structure 441. The semiconductor die 610 may also, for example, be connected to another circuit through the interconnection structure 611, the conductive layer 442 of the protective plate 440, the interconnection structure 441, the conductive trace 121, and the conductive via 122.

Note that although the protective plate 440 is shown coupled to the semiconductor die 110 with the interconnection structures 611, and coupled to the substrate with the interconnection structures 441 and/or bezel 150, one or more of such couplings may be omitted. For example, in an example implementation in which the protective plate 440 is a plate of another device (e.g., a consumer electronic device in which the fingerprint sensor device 600 is integrated), the protective plate 440 might be a portion of a larger plate (e.g., window, coating, display screen, etc.). In such an implementation, the bezel 150 may be omitted or reconfigured (e.g., to not extend higher than the bottom side 440b of the protective plate 440), since the top surface 440a and/or lateral surfaces of the protective plate 440 might not be accessible to the fingerprint sensor device 600.

In the example implementation 900, the fingerprint sensing unit 612 may for example sense fingerprints through the protective plate 440, through a gap between the fingerprint sensing unit 612 (e.g., if such gap exists, and whether or not such gap is filled with adhesive material or underfill), etc. Also note that the protective plate 440 may, as part of conductive layer 442 or otherwise, include fingerprint sensing electrodes that are electrically coupled to the fingerprint sensing unit 112 through the interconnection structures 611.

The discussion herein included numerous illustrative figures that showed various portions of an electronic device (e.g., a fingerprint sensor device) and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a fingerprint sensor device and a method of making a fingerprint sensor device. As non-limiting examples, various aspects of this disclosure provide various fingerprint sensor devices, and methods of manufacturing thereof, that comprise a sensing area on a bottom side of a die without top side electrodes that senses fingerprints from the top side, and/or that comprise a sensor die directly electrically connected to conductive elements of a plate through which fingerprints are sensed. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A fingerprint sensor device comprising:
    a substrate having a top substrate side, a bottom substrate side, and lateral substrate sides between the top and bottom substrate sides;
    a semiconductor die having a top die side, a bottom die side, and lateral die sides between the top and bottom die sides, wherein the semiconductor die operates to sense a fingerprint of a finger positioned above the top die side;
    a plurality of conductive interconnection structures electrically connecting the bottom die side to the top substrate side; and
    a unitary encapsulant surrounding at least the lateral die sides and covering at least a portion of the top substrate side, wherein no portion of the encapsulant is higher than the top die side, and wherein no portion of the bottom substrate side is covered by the unitary encapsulant.

2. The fingerprint sensor device of claim 1, wherein no portions of the lateral substrate sides are covered by the unitary encapsulant.

3. The fingerprint sensor device of claim 1, wherein the entire top side of the encapsulant that is laterally outside of a perimeter of the semiconductor die is in a single plane.

4. The fingerprint sensor device of claim 1, comprising a protective layer that directly contacts and covers at least a portion of the top die side, wherein the protective layer comprises only a single layer of a single material, and said at least a portion of the top die side is covered by no material other than the protective layer.

5. The fingerprint sensor device of claim 1, comprising a protective layer of a single material that directly contacts and covers the top die side and at least a portion of the top side of the encapsulant, and wherein the protective layer comprises a polymer coating.

6. The fingerprint sensor device of claim 1, wherein the encapsulant is exposed at the top side of the fingerprint sensor device.

7. The fingerprint sensor device of claim 6, wherein the bottom die side comprises bottom side electrical circuitry that comprises a fingerprint sensing unit.

8. The fingerprint sensor device of claim 1, wherein the fingerprint sensor device comprises a fingerprint sensor package, and comprising a conductive interconnect at the bottom substrate side and accessible at a bottom side of the fingerprint sensor package.

9. The fingerprint sensor device of claim 1, wherein the encapsulant is a molded encapsulant.

10. A method of manufacturing a fingerprint sensor device, the method comprising:
    providing a substrate having a top substrate side, a bottom substrate side, and lateral substrate sides between the top and bottom substrate sides;
    providing a semiconductor die having a top die side, a bottom die side, and lateral die sides between the top and bottom die sides, wherein the semiconductor die operates to sense a fingerprint of a finger positioned above the top die side;
    connecting the bottom die side to the top substrate side utilizing a plurality of conductive interconnection structures; and forming a unitary encapsulant surrounding at least the lateral die sides and covering at least a portion of the top substrate side, wherein no portion of the encapsulant is higher than the top die side, and wherein no portion of the bottom substrate side is covered by the unitary encapsulant.

11. The method of claim 10, wherein no portion of the lateral substrate sides is covered by the unitary encapsulant.

12. The method of claim 10, wherein said forming the encapsulant comprises forming the encapsulant such that the entire top side of the encapsulant around a perimeter of the semiconductor die is in a single plane.

13. The method of claim 10, comprising forming a protective layer that directly contacts and covers at least a portion of the top die side.

14. The method of claim 13, wherein the protective layer comprises only a single layer of a single material, and said at least a portion of the top die side is covered by no material other than the protective layer.

* * * * *